(12) United States Patent
Tsukuda et al.

(10) Patent No.: US 9,184,264 B2
(45) Date of Patent: Nov. 10, 2015

(54) MANUFACTURING METHOD OF SEMICONDUCTOR DEVICE

(71) Applicant: Renesas Electronics Corporation, Kawasaki-shi, Kanagawa (JP)

(72) Inventors: Eiji Tsukuda, Kawasaki (JP); Kozo Katayama, Kawasaki (JP); Kenichiro Sonoda, Kawasaki (JP); Tatsuya Kunikiyo, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/586,452

(22) Filed: Dec. 30, 2014

(65) Prior Publication Data

US 2015/0111357 A1    Apr. 23, 2015

Related U.S. Application Data

(63) Continuation of application No. 14/155,961, filed on Jan. 15, 2014, now Pat. No. 8,956,941.

(30) Foreign Application Priority Data

Jan. 25, 2013  (JP) ................................. 2013-011820

(51) Int. Cl.
| H01L 21/336 | (2006.01) |
| H01L 29/66 | (2006.01) |
| H01L 29/792 | (2006.01) |
| H01L 27/115 | (2006.01) |
| H01L 29/423 | (2006.01) |

(52) U.S. Cl.
CPC .... *H01L 29/66833* (2013.01); *H01L 27/11563* (2013.01); *H01L 27/11568* (2013.01); *H01L 27/11573* (2013.01); *H01L 29/4234* (2013.01); *H01L 29/792* (2013.01)

(58) Field of Classification Search
USPC ......................................... 438/287
See application file for complete search history.

(56) References Cited

U.S. PATENT DOCUMENTS

| 8,450,790 | B2 | 5/2013 | Kawashima |
| 2004/0188753 | A1 | 9/2004 | Kawashima et al. |
| 2009/0231921 | A1* | 9/2009 | Kimura et al. ........... 365/185.18 |
| 2010/0200909 | A1 | 8/2010 | Kawashima et al. |
| 2010/0255670 | A1 | 10/2010 | Onda |
| 2011/0001179 | A1 | 1/2011 | Yanagi et al. |
| 2011/0039385 | A1 | 2/2011 | Shinmamoto et al. |

FOREIGN PATENT DOCUMENTS

| JP | 2010-282987 A | 12/2010 |
| JP | 2011-029631 A | 2/2011 |
| JP | 2011-049282 A | 3/2011 |

* cited by examiner

*Primary Examiner* — Karen Kusumakar
(74) *Attorney, Agent, or Firm* — Sughrue Mion, PLLC

(57) ABSTRACT

To provide a manufacturing method of a semiconductor device including a memory cell having a higher reliability. First and second stacked structures in a memory cell formation region are formed so as to have a larger height than a third stacked structure in a transistor formation region, and then an interlayer insulating layer is formed so as to cover these stacked structures and then polished.

13 Claims, 27 Drawing Sheets

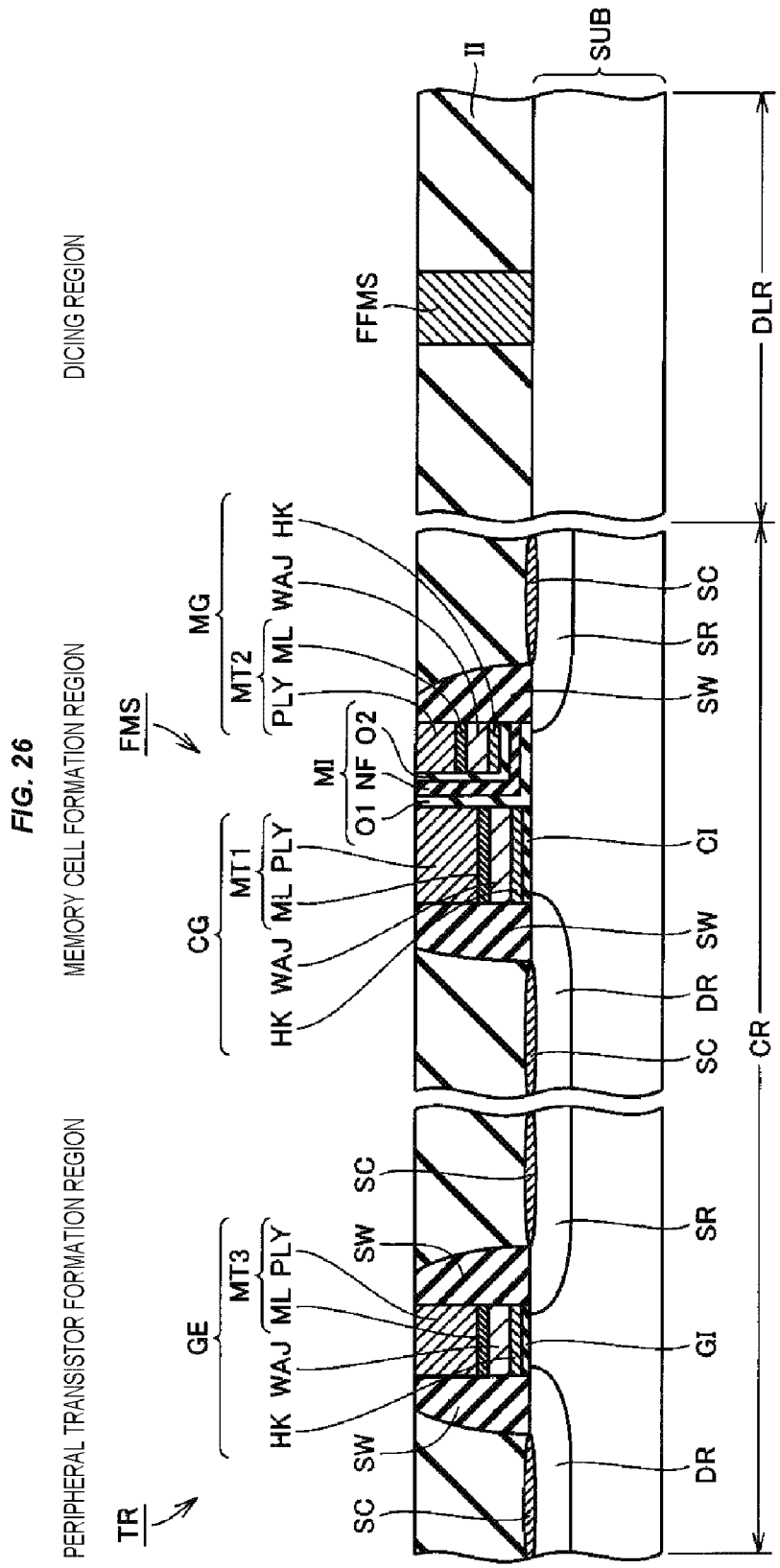

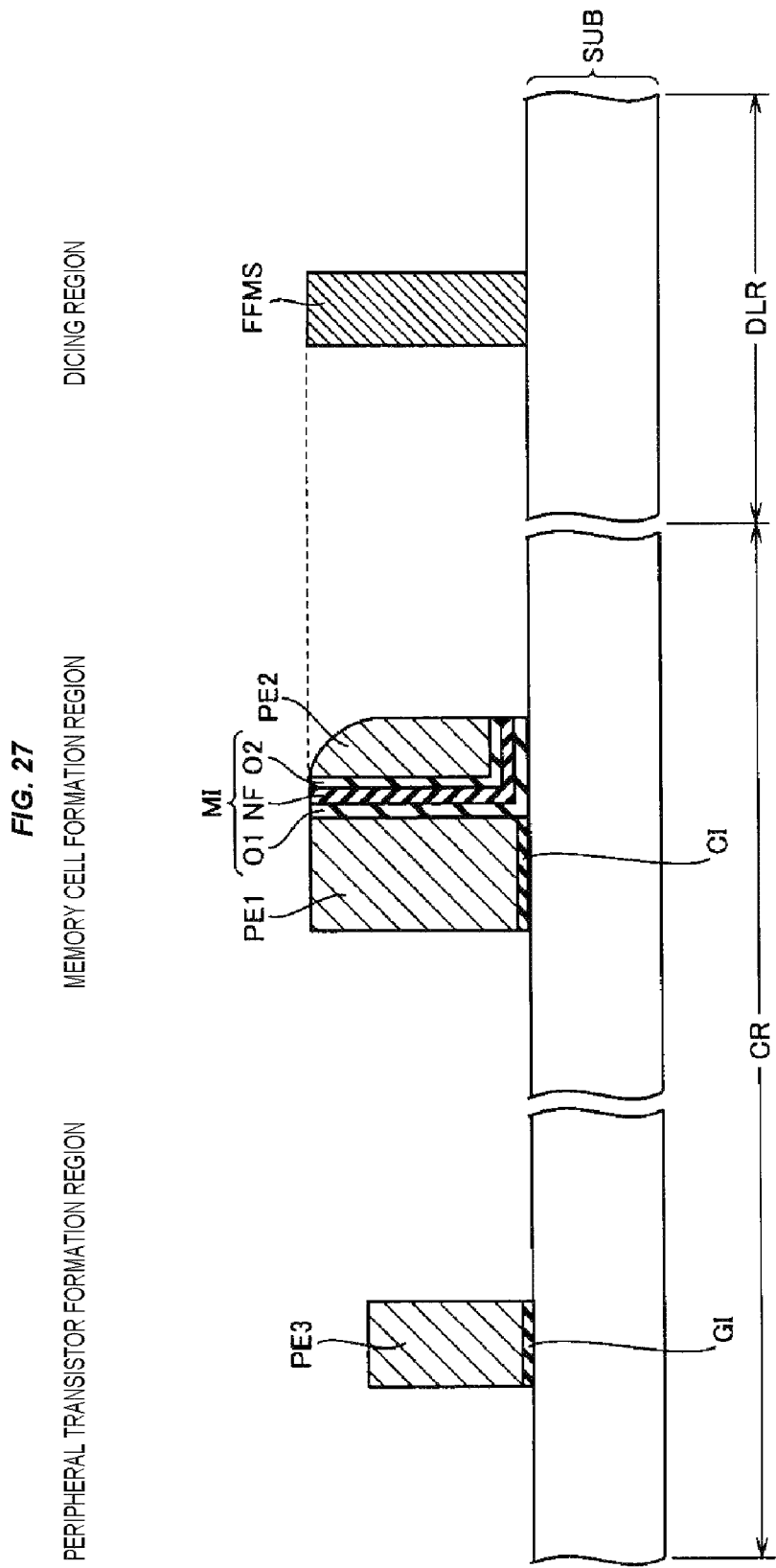

MANUFACTURING METHOD OF SEMICONDUCTOR DEVICE

CROSS-REFERENCE TO RELATED APPLICATION

This application is a continuation application of U.S. application Ser. No. 14/155,961, filed Jan. 15, 2014, which claims priority from the disclosure of Japanese Patent Application No. 2013-011820 filed on Jan. 25, 2013 including the specification, drawings and abstract, which are incorporated herein by reference in their entirety.

BACKGROUND

The present invention relates to a manufacturing method of a semiconductor device, and in particular, relates to a manufacturing method of a semiconductor device which includes a memory cell having a plurality of gates.

There is considered, for example, a microcomputer as a semiconductor device including a flash memory and a CPU (Central Processing Unit). For example, it is preferable that the flash memory uses a nonvolatile memory which is an element in which recorded information remains when power is shut down. By mounting the nonvolatile memory and a logic semiconductor device over the same semiconductor substrate in a mixed state, it is possible to form a microcomputer having a high performance. The microcomputer in which mounts the nonvolatile memory and the logic semiconductor device are arranged is used widely for industrial machines, home appliances, car-mounted apparatuses, and the like.

Generally, the nonvolatile memory included in the microcomputer stores a program necessary for the microcomputer and is used for optional read-out of the program. Therefore, it is preferable to use the microcomputer which mounts the nonvolatile memory and the logic semiconductor device in a mixed state. An example for a memory cell structure of such a nonvolatile memory which is suitable for the mixed mounting with the logic semiconductor device includes a memory cell having a sprit gate structure in which a control MIS (Metal Insulator Semiconductor) transistor and a storage MIS transistor are formed in an integrated manner.

Among the memory cells having the split gate structures, a MONOS (Metal Oxide Nitride Oxide Silicon) type memory cell using MONOS for the storage MIS transistor is disclosed in, for example, Japanese Patent Laid-Open No. 2011-29631 (Patent Document 1).

Meanwhile, since realization of a thinner gate insulating film has been limited recently in the MIS transistor, a structure obtained by using a high dielectric constant insulating film (so-called, high-k film) for the gate insulating film and using a metal film as a gate electrode is disclosed in Japanese Patent Laid-Open No. 2011-49282 (Patent Document 2), for example.

Furthermore, for the MONOS-type memory cell, a structure in which the storage MIS transistor is formed in a side wall part of the control MIS transistor is disclosed in Japanese Patent Laid-Open No. 2010-282987 (Patent Document 3), for example.

SUMMARY

Around the MONOS-type memory cell, there is formed a peripheral circuit MIS transistor for a microcontroller and the like which are coupled to the memory cell control transistor and the memory cell. When the high dielectric constant insulating film is used as the gate insulating film and a metal film is used for the gate electrode in order to cause the peripheral circuit MIS transistor to have a high performance, it is necessary to apply a gate-last process as disclosed in Patent Document 2.

In the gate-last process, once a dummy gate electrode is formed of polycrystalline silicon and the dummy gate electrode is removed after a side wall structure in contact with the gate electrode has been formed. Then, the high dielectric constant insulating film and the metal film are embedded in the removed part and a gate structure is formed.

In contrast, the storage MIS transistor of the MONOS-type memory cell shown in Patent Document 3 is formed on the side wall of the control MIS transistor and formed by a gate-first process not using the dummy gate electrode.

Therefore, when the MONOS-type memory cell shown in Patent Document 3 and the peripheral circuit MIS transistor, which has the gate insulating film of the high dielectric constant insulating film and the metal gate electrode, are formed together, it becomes necessary to perform the gate-first process and the gate-last process, and thus the number of processes is increased and reliability is degraded.

The other problems and new feature will become clear from the description of the present specification and the accompanying drawings.

According to one embodiment, after first and second stacked structures have been formed in a memory formation region so as to have a larger height than that of a third stacked structure in a peripheral circuit transistor, an interlayer insulating film is formed so as to cover these structures and then polished.

According to the one embodiment, it is possible to manufacture a semiconductor device having a high reliability.

BRIEF DESCRIPTION OF THE DRAWINGS

FIG. 26 is a schematic cross-sectional view of a memory cell, a peripheral transistor as a peripheral circuit for the memory cell, and a dicing region in a fourth embodiment; and FIG. 27 is a schematic cross-sectional view showing one process in a manufacturing method for a semiconductor device of a fourth embodiment.

DETAILED DESCRIPTION

Hereinafter, one embodiment will be explained according to the drawings.

(First Embodiment)

First, a configuration of a memory cell included in a semiconductor device of one embodiment will be explained using FIG. 1 to FIG. 3.

Figure 1:
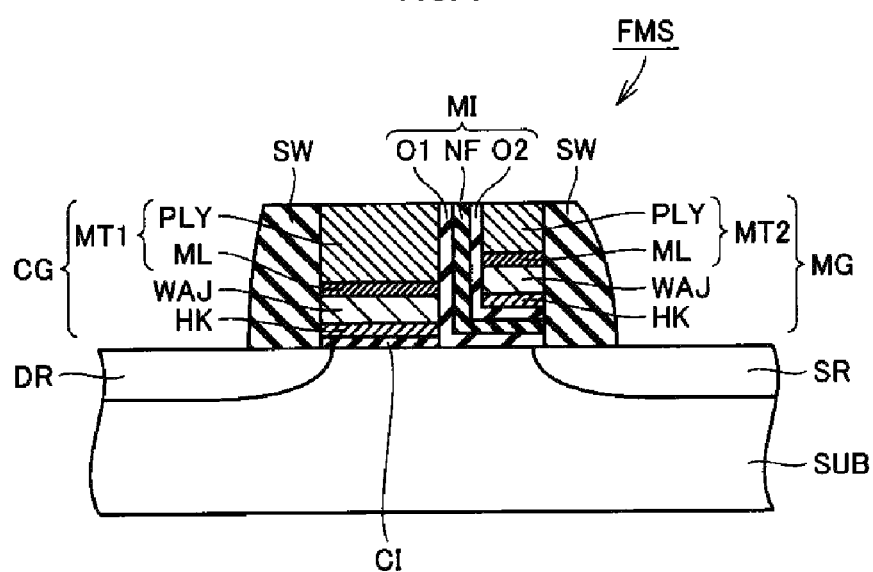
FIG. 1 is a schematic cross-sectional view of a memory cell constituting a semiconductor device of one embodiment.

With reference to FIG. 1, the semiconductor device of the one embodiment includes an FMONOS-type memory cell FMS (hereinafter, described as "memory cell FMS") as a memory cell. The memory cell FMS is formed in a semiconductor substrate SUB having a major surface.

The semiconductor substrate SUB is formed of a silicon single crystal, for example. A drain region DR and a source region SR are formed at intervals from each other on the major surface of the semiconductor substrate SUB (surface extending in the horizontal direction as a top surface of the semiconductor substrate SUB in FIG. 1). The drain region DR and the source region SR are formed by means of diffusing impurities of the so-called n-type or p-type, and disposed so as to sandwich a control gate (first gate) and a memory gate (second gate) to be described later.

Note that, while usually silicide films to be described later are formed on the upper surfaces of the drain region DR and the source region SR, illustration thereof is omitted here.

A control gate insulating film CI (first insulating film) is formed over the major surface of the semiconductor substrate SUB, and a control gate film CG (first metal-containing film) is formed so as to be in contact with the upper surface of the control gate insulating film CI. The control gate film CG performs read, write, and erase operations, and here the control gate film CG is defined to be a film including a high dielectric constant insulating film HK and an adjustment film WAJ in addition to a metal film ML and a polycrystalline silicon film PLY as a metal-containing film MT1 to which voltage is applied. The control gate film CG has a configuration in which the high dielectric constant insulating film HK (dielectric film) which has a higher dielectric constant than the control gate insulating film CI, the adjustment film WAJ, the metal film ML, and the polycrystalline silicon film PLY are stacked in this order. In this manner, the control gate insulating film CI and the control gate film CG are stacked and the control gate (first gate) is formed.

The control gate insulating film CI is formed of, for example, a silicon oxide film that has the same material as a gate insulating film in an ordinary MOS-type transistor. This gate insulating film CI is formed for improving adhesiveness between the semiconductor substrate SUB and the control gate film CG and for suppressing an interface state.

The high dielectric constant insulating film HK is an insulating film formed of a material having a significantly high dielectric constant compared with the silicon oxide film of the control gate insulating film CI, and for example, a hafnium-series oxide film is used. By the formation in series of the typical gate insulating film CI and the high dielectric constant insulating film HK, the dielectric constant of an entire film combining both insulating films is increased, and thus it is possible to make higher the capacitance value of a MOS capacitance part.

The adjustment film WAJ is a thin film formed for adjusting (reducing) the work function of the entire control gate film CG which includes the high dielectric constant insulating film HK, and resultantly adjusting (reducing) the threshold voltage value of the control gate film CG. There is used, for example, a lanthanoid-series oxide film.

Although the high dielectric constant insulating film HK is used for increasing the MOS capacitance as described above, through the use of the high dielectric constant insulating film HK, there is a case where the work function of the control gate film CG becomes difficult to be controlled, including the case where the work function is not reduced. The adjustment film WAJ is formed for facilitating the control of (for reducing) the work function.

The metal-containing film MT1 is formed of the metal film ML and the polycrystalline silicon film PLY. As the metal film ML, there is used a thin film of titanium nitride or tantalum nitride, which has a good adhesiveness to other materials.

A memory gate insulating film MI (second insulating film) is formed so as to be in contact with the side faces of the control gate insulating film CI and the control gate film CG on one side (side faces on the right-hand side in FIG. 1) and to have an extension part extending over the major surface of the semiconductor substrate SUB.

A memory gate film MG (second metal-containing film) is formed so as to be in contact with both of the side face part and the upper surface of the extension part in the memory gate insulating film MI. The memory gate film MG is a film which performs flash operation for write and erase, and here, the memory gate film MG is defined to be a film which includes a high dielectric constant insulating film HK and an adjustment film WAJ, in addition to a metal film ML and a polycrystalline silicon film PLY as a metal-containing film MT2 to which voltage is applied. That is, the memory gate film MG is formed so as to be in contact with both of the side face part and the upper surface of the extension part in the memory gate insulating film MI, and, as with the control gate film CG, has a configuration in which the high dielectric constant insulating film HK, the adjustment film WAJ, the metal film ML, and the polycrystalline silicon film PLY are stacked in this order. The functions of the high dielectric constant insulating film HK and the adjustment film WAJ in the memory gate film MG are the same as the respective functions of the high dielectric constant insulating film HK and the adjustment film WAJ in the above-described control gate film CG. In this way, the memory gate (second gate) obtained by stacking the memory gate insulating film MI and the memory gate film MG is formed.

The memory gate insulating film MI has a configuration in which three layers of a (first) silicon oxide film O1 (SiO$_2$, etc.), a silicon nitride film NF (SiN, etc.), and a (second) silicon oxide film O2 (SiO$_2$, etc.) are stacked in this order, in the same way as in a typical MONOS-type memory cell. Data write of the memory cell FMS is performed by electron injection into, particularly, the silicon nitride film NF among these films, and data erase of the memory cell FMS is performed by hole injection into the silicon nitride film NF. The threshold voltage value of the memory cell FMS is increased in the date write and the threshold voltage value of the memory cell FMS is decreased in the data erase.

In this way, the memory gate insulating film MI includes a charge accumulation film which accumulates electrons or holes being charged for the data write and erase, and here the silicon nitride film NF corresponds to the charge accumulation film. The memory gate insulating film MI including the silicon nitride film NF is an essential constituent for exerting a normal function of the MONOS-type memory cell FMS.

As described above, the memory cell FMS includes two gate electrodes of the control gate film CG and the memory gate film MG, and thus can perform two operations of the write/erase flash operation and the read operation individually. The control gate film CG and the memory gate film MG are formed so as to overlap parts of the above-described drain region DR and source region SR, respectively, directly thereabove.

In the memory cell FMS of FIG. 1, each of the control gate film CG and the memory gate film MG has a flat surface (upper surface), and also the control gate film CG and the memory gate film MG are so-called flush with each other so as to have the same height (thickness). In other words, the heights of the control gate film and the memory gate film are the same as each other. While this is because the upper surface is polished by CMP (Chemical Mechanical Polishing), both surfaces need not be flush with each other if an opening part can be secured. Here, "flat" means a state where unevenness scarcely exists and also the surface is approximately parallel to the major surface of the semiconductor substrate SUB.

Furthermore, similarly, also the surface of the side face part in the memory gate insulating film MI of FIG. 1 is so-called flush with the surfaces of the control gate film CG and the memory gate film MG so as to have the same height (thickness), and the edge part of the extension part (edge part on the right-hand side in FIG. 1) in the memory gate insulating film MI is so-called flush with the edge part of the memory gate film MG so as to have the same plane.

Note that, while the drain region DR and the source region SR are illustrated simply in FIG. 1, actually each of these regions DR and SR may include, in addition to a typical drain region DR (source region SR), a region called LDD (Light Doped Drain) having a lower n-type or p-type impurity concentration than the typical drain region (source region SR), and also may include an impurity diffusion region called the so-called extension or halo.

Furthermore, the memory cell FMS includes a side wall insulating film SW so as to cover side faces of the control gate film CG and the memory gate film MG. While the side wall insulating film SW is preferably configured with a stacked structure of, for example, a silicon oxide film and a silicon nitride film, the stacked structure is omitted from illustration here.

Figure 2:
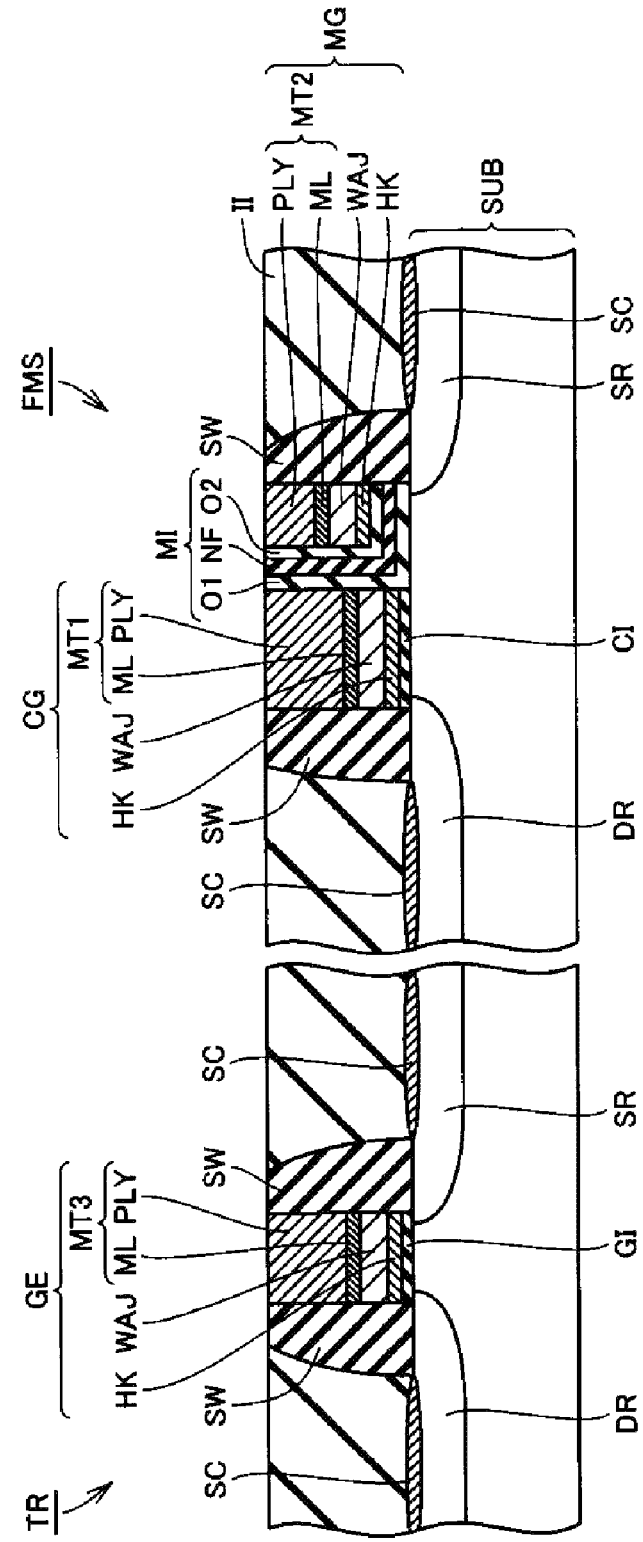
FIG. 2 is a schematic cross-sectional view of the memory cell in FIG. 1 and a peripheral transistor as a peripheral circuit for the memory cell.
Figure 3:
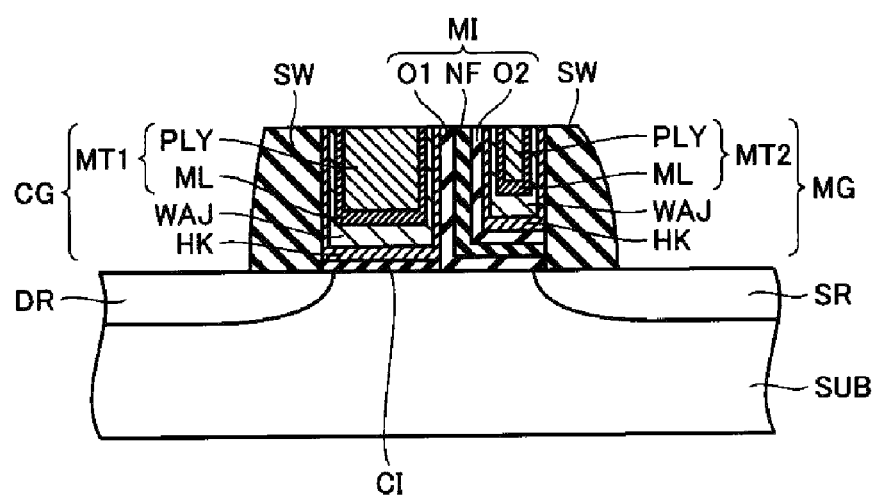
FIG. 3 is a schematic cross-sectional view showing another shape of the control gate film and the memory gate film of the memory cell in FIG. 1.

With reference to FIG. 2, the major surface of the semiconductor substrate SUB includes, for example, a transistor TR such as a MOS-type transistor other than the memory cell FMS. This transistor TR is a so-called peripheral transistor which is formed, with a gap, separated from the memory cell FMS, as a peripheral circuit for the memory cell FMS.

The transistor TR, as with a typical MOS-type transistor, includes a drain region DR and a source region SR which are formed on the major surface of the semiconductor substrate SUB at intervals from each other (so as to sandwich a third gate to be described later). Further, a gate insulating film GI (third insulating film) and a gate film GE (third metal-containing film) in contact with the upper surface of the gate insulating film GI are formed over the major surface of the semiconductor substrate SUB. Here, the gate film GE is set to include a high dielectric constant insulating film HK and an adjustment film WAJ in addition to a metal film ML and a polycrystalline silicon film PLY as a metal-containing film MT3 to which voltage is applied. In this way, a gate (third gate) obtained by stacking the gate insulating film GI and the gate film GE is formed.

That is, the gate film GE, as with the control gate film CG and the like, has a configuration in which the high dielectric constant insulating film HK, the adjustment film WAJ, the metal film ML, and the polycrystalline silicon film PLY are stacked in this order. The respective functions of the high dielectric constant insulating film HK and the adjustment film WAJ in the gate film GE are the same as the above-described functions of the high dielectric constant insulating film HK and the adjustment film WAJ in the control gate film CG and the memory gate film MG.

Furthermore, in the transistor TR of FIG. 2, the gate film GE has a flat surface (upper surface) and also the gate film GE is so-called flush with the control gate film CG and the memory gate film MG at the surface so as to have the same height (thickness). In other words, all the heights of the control gate, memory gate, and the gate are the same as one another.

While, in FIG. 2, the same reference sign is attached to the constituents which are common to the memory cell FMS and the transistor TR, these constituents have the same configuration and are formed as the same layer.

While omitted from FIG. 1, as actually shown in FIG. 2, in the regions where the memory cell FMS and the transistor TR are formed, an interlayer insulating layers II is formed so as to surround each of the gate electrodes. This interlayer insulating layer II is formed of, for example, a silicon oxide film.

Furthermore, in FIG. 2, the silicide films SC are formed on the upper surfaces of the drain regions DR and the source regions SR in both of the memory cell FMS and the transistor TR. The silicide film SC is a thin film formed in the vicinity of the top surface in the drain region DR or the source region SR by reaction of a silicon element constituting the drain region DR or the like and cobalt or nickel element formed thereover.

Note that, while the transistors TR and the memory cells FMS are formed, in a plural number, in the semiconductor substrate SUB, and between the neighboring pair of transistors TR (memory cells FMS), there is formed, typically, an isolation insulating film for electrical isolation therebetween, illustration thereof is omitted here.

Here, as will be described later, there are formed the high dielectric constant insulating film HK, the metal film ML, and the like, which constitute each of the control gate film CG, the memory gate film MG, and the like in FIG. 1 and FIG. 2, so as to be embedded in an opening part where the dummy gate electrode has been removed. At this time, when the control gate film CG and the memory gate film Mg are deposited by a sputtering method or the like, the control gate film CG and the memory gate film Mg are formed as shown in FIG. 1, and FIG. 2. However, when deposited through the use of a CVD method such as a MOCVD (Metal Organic Chemical Vapor Deposition) method using organic source gas, each of the control film CG and the memory gate film MG is formed so as to have a cross-sectional shape of a cup shape to cover the bottom face and the side face of the opening part as shown in FIG. 3. In the following, while explanation will be made using the control gate film CG and the memory gate film MG of the FIG. 1 and FIG. 2, each of the control gate film CG and the memory gate film MG may have a shape as shown in FIG. 3.

Next, with reference to FIG. 4 to FIG. 12, a manufacturing method of the above-described semiconductor device of the one embodiment will be explained.

Figure 4:
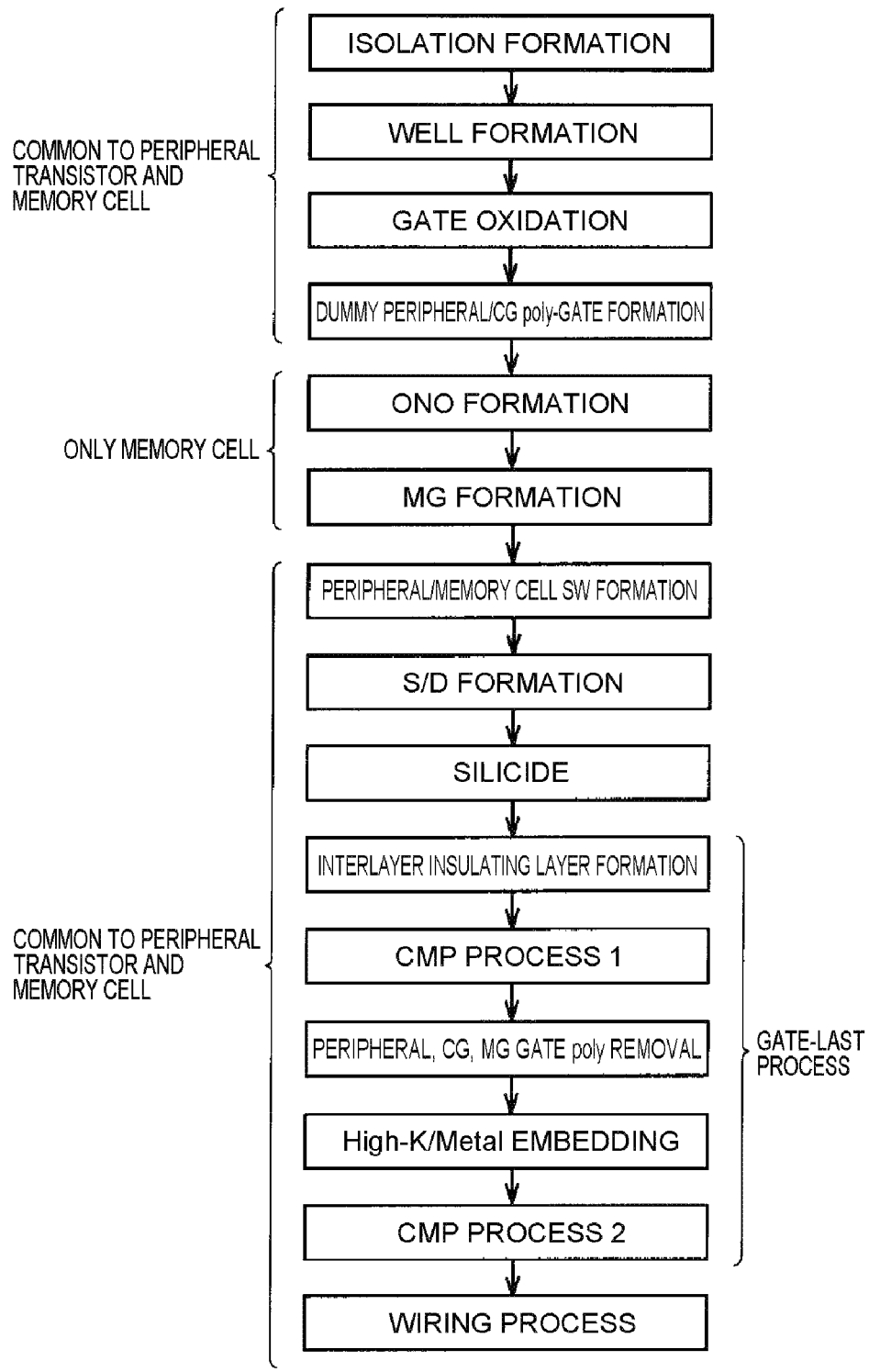
FIG. 4 is a flowchart explaining a manufacturing method for a semiconductor device of one embodiment.

First, the semiconductor substrate SUB (refer to FIG. 1 to FIG. 3) including, for example, the silicon single crystal is prepared. With reference to FIG. 4, a plurality of element isolation insulating films is formed on the major surface of the semiconductor substrate SUB at intervals from each other by, for example, a typical LOCOS (LOCal Oxidation of Silicon) method or by an STI (Shallow Trench Isolation) method (corresponding to "isolation formation" in FIG. 4). In addition, on the major surface of the semiconductor substrate SUB, a well region in which impurities are diffused is formed as necessary in a region sandwiched by the element isolation films adjacent to each other (corresponding to "well formation" in FIG. 4). As to these, illustration is omitted.

Figure 5:
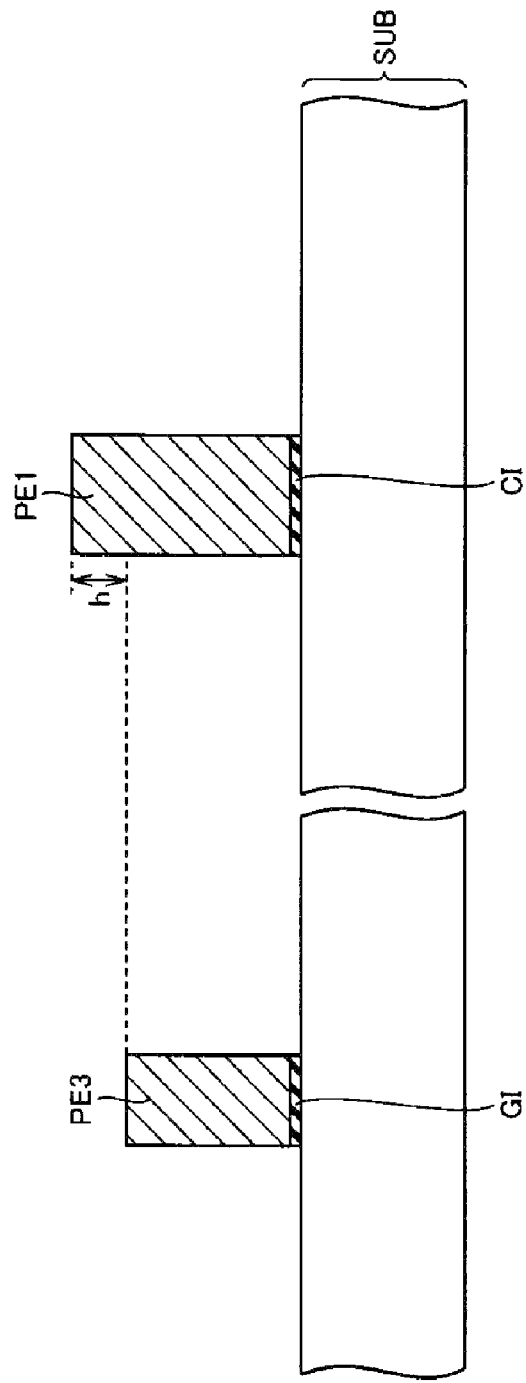
FIG. 5 is a schematic cross-sectional view showing the first process in a manufacturing method for a semiconductor device of one embodiment.

Furthermore, with reference to FIG. 4 and FIG. 5, in a memory cell formation region where the memory cell is formed, on the major surface of the semiconductor substrate SUB, there are formed, at the same time, the control gate insulating film CI (first insulating film), and the gate insulating film GI (third insulating film) in a peripheral transistor formation region where the peripheral transistor is formed (corresponding to "gate oxidation" in FIG. 4). These are silicon oxide films formed by, for example, a typical thermal oxidation method, and are formed into desired patterns by typical photolithography and etching.

Successively, with reference to FIG. 4, and FIG. 5, a first dummy electrode PE1 in contact with the upper surface of the control gate insulating film CI and a third dummy electrode PE3 in contact with the upper surface of the gate insulating film GI are formed at the same time (corresponding to "dummy peripheral/CG poly-gate formation" in FIG. 4). These dummy electrodes PE1 and PE3 are formed of polycrystalline silicon thin films by, for example, a CVD (Chemical Vapor Deposition) method. In this way, there are formed a first stacked structure obtained by stacking the control gate insulating film CI and the first dummy electrode PE1, and a third stacked structure obtained by stacking the gate insulating film GI and the third dummy electrode PE3. The first dummy electrode PE1 is a dummy control gate for forming the memory cell and the third dummy electrode PE3 is a dummy gate for forming the peripheral transistor.

Here, the first stacked structure including the first dummy electrode PE1 is formed to have a larger height by h of FIG. 5 than the third stacked structure including the third dummy electrode PE3. Here, "height" means a distance from the major surface of the semiconductor substrate SUB in the vertical direction of the drawing.

Specifically, after the first dummy electrode PE1 and the third dummy electrode PE3 have been deposited first at the same time to thereby be formed to have the same thickness, the upper surface of the third dummy electrode PE3 is removed by etching in a state in which photo-resist covering the first dummy electrode PE1 is formed. Thereby, it is possible to make the first dummy electrode PE1 thicker than the third dummy electrode PE3.

Except that the first dummy electrode PE1 and the third dummy electrode PE3 are formed so as to have different thicknesses, the above respective processes are common to both of the transistor formation region and the memory cell formation region.

Figure 6:
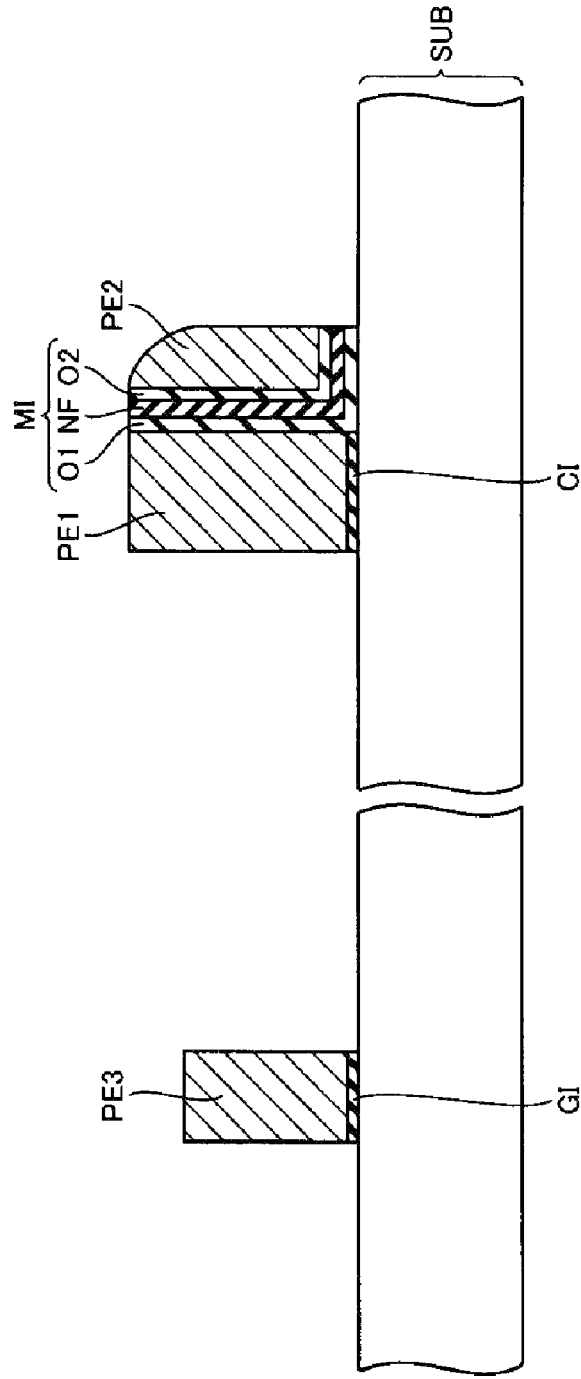
FIG. 6 is a schematic cross-sectional view showing the second process in a manufacturing method for a semiconductor device of one embodiment.

With reference to FIG. 4 and FIG. 6, in the memory formation region, the memory gate insulating film MI is formed on the major surface of the semiconductor substrate SUB (corresponding to "ONO formation" in FIG. 4). The memory gate insulating film MI is formed so as to be in contact with the side face of the first stacked structure and also to have the extension part that extends over the major surface of the semiconductor substrate SUB. Specifically, as the memory gate insulating film MI, three layers of the silicon oxide film O1, the silicon nitride film NF, and the silicon oxide film O2 are stacked in this order. These insulating films O1, NF, and O2 are formed by, for example, a typical CVD method.

At this time, the three layers of the silicon oxide film O1, the silicon nitride film NF, and the silicon oxide film O2 are stacked in this order over the major surface of the semiconductor substrate SUB so as to cover the side face and the upper surface of the first stacked structure.

Next, there is formed a second dummy electrode PE2 in contact with the memory gate insulating film MI, including the upper surface of the extension part in the memory gate insulating film (corresponding to "MG formation" in FIG. 4). The second dummy electrode PE2 is a polycrystalline silicon thin film formed by, for example, a CVD method. Specifically, after the polycrystalline silicon thin film has been formed so as to cover the upper surface of the first stacked structure and the side face part and the upper surface of the extension part in the memory gate insulating film MI, in FIG. 6, the polycrystalline silicon and the memory gate insulating film MI are etched back by anisotropic etching. As a result, as shown in FIG. 6, the dummy electrode PE2 configured with the polycrystalline silicon and the memory gate insulating film MI are formed as the side wall of the first stacked structure. After that, unnecessary part is removed by typical photolithography and etching and thus the structure of FIG. 6 is formed. In this way, there is formed a second stacked structure obtained by stacking the memory gate insulating film MI and the second dummy electrode PE2. The second dummy electrode PE2 is a dummy memory gate film for forming the memory cell.

Here, the second stacked structure including the second dummy electrode PE2 is formed so as to have a larger height than the third stacked structure including the third dummy electrode PE3. Since the first dummy electrode PE1 is formed so as to have a larger height than the third dummy electrode PE3, also the second stacked structure including the second dummy electrode PE2 is formed so as to have a larger height than the third stacked structure, as with the first stacked structure.

However, the upper surface of the second dummy electrode PE2 is formed so as not to be flat but to have a shape sloping down toward the right-hand side as shown in FIG. 6. Therefore, more preferably, in the second dummy electrode PE2, at least the region having the largest height (region contacting the silicon oxide film O2) is formed so as to have a larger height than the first stacked structure and also the region having the smallest height (region having the smallest height in the shape sloping down toward the right-hand side) is formed so as to have a larger height than the third stacked structure.

While each of the above processes is performed only on the memory cell formation region, each of the subsequent processes is common to both of the peripheral transistor formation region and the memory cell formation region.

Figure 7:
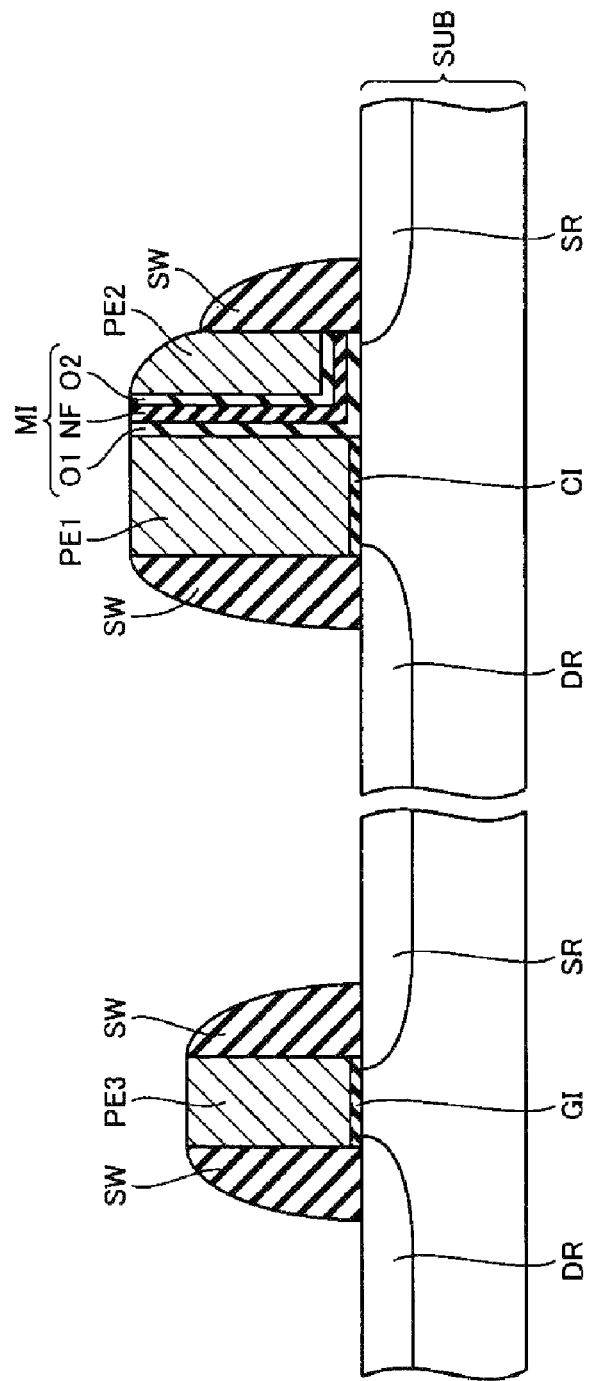
FIG. 7 is a schematic cross-sectional view showing the third process in a manufacturing method for a semiconductor device of one embodiment.

With reference to FIG. 4 and FIG. 7, in the peripheral transistor formation region and the memory cell formation region, the side wall insulating film SW is formed so as to cover the side faces of the first, second, and third stacked structures (corresponding to "peripheral/memory cell SW formation" in FIG. 4). After the insulating film has been formed so as to cover the side faces and the upper surfaces of the first, second, and third stacked structures, the insulating film is etched back by anisotropic dry etching, and thus the side wall insulating films SW are formed. While the side wall insulating film may be formed of only one layer of either a silicon oxide film or a silicon nitride film, the side wall insulating film may be formed of a stacked structure of the silicon oxide film and the silicon nitride film.

With reference to FIG. 4 and FIG. 7, the source region SR and the drain region DR of the memory cell are formed, in the memory cell formation region, on the major surface of the semiconductor substrate SUB by performing ion implantation of impurities from the major surface of the semiconductor substrate SUB by a self-alignment technique using the structure of the first and second stacked structures and the side wall insulating film SW (corresponding to "S & D formation" in FIG. 4). Similarly, the source region SR and the drain region DR of the peripheral transistor are formed, in the peripheral transistor formation region, on the major surface of the semiconductor substrate SUB by a self-alignment technique using the structure of the third stacked structure and the side wall insulating film SW.

After that, the semiconductor substrate SUB is subjected to thermal treatment by so-called RTA (Rapid Thermal Anneal), for example, for repairing the crystalline state of the region where the drain region DR and the source region SR have been formed.

Incidentally, in FIG. 7, each of the drain region DR and the source region SR is formed so as to be spread to a part of the region directly under each of the first dummy electrode PE1 and the third dummy electrode PE3 inside the side wall insulating films SW. For realizing this structure, by ion-implantation of impurities once from the major surface of the semiconductor substrate SUB by a self-alignment technique using the first to third stacked structures after the formation of the first to third stacked structures and before the formation of the side wall insulating films SW, for example, so-called LDD regions are preferably formed each having a lower impurity concentration than the above-described drain region DR and source region SR. That is, in this case, the LDD regions are formed after the formation of the first to third stacked structures, and then the side wall insulating films SW are formed. Furthermore, after that, the drain regions DR and the source regions SR are formed.

Figure 8:
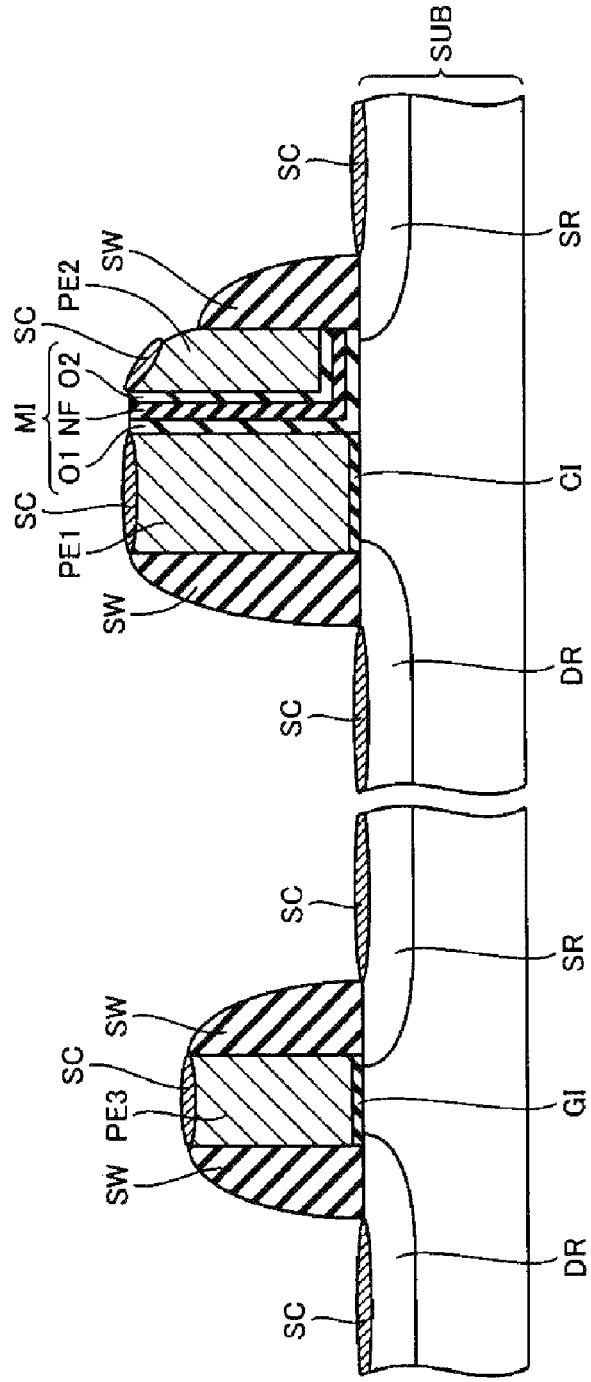
FIG. 8 is a schematic cross-sectional view showing the fourth process in a manufacturing method for a semiconductor device of one embodiment.

With reference to FIG. 4 and FIG. 8, the silicide films SC are formed on the upper surfaces of the first dummy electrode PE1, the second dummy electrode PE2, the third dummy electrode PE3, the drain regions DR, and the source regions SR (corresponding to "silicide" in FIG. 4). Specifically, a cobalt or nickel metal film, for example, is formed over the major surface of the semiconductor substrate SUB by a general metal thin film formation method such as, for example, a sputtering method, so as to cover the upper surfaces of the first, second, and third dummy electrodes PE1, PE2, and PE3.

Next, while not illustrated, the semiconductor substrate SUB is subjected to thermal treatment in this state. Specifically, the semiconductor substrate SUB, for the case of nickel, for example, is heated at a temperature not less than 500° C. and not more than 600° C. for a time not less than twenty seconds and not more than three minutes, for example. Then, silicon elements constituting the drain region DR and the source region SR react with nickel elements formed thereover and the silicide films SC are formed. However, in the case of the cobalt, the semiconductor substrate SUB is heated at a temperature not less than 700° C. and not more than 800° C. The dummy electrodes PE1 to PE3 also react similarly with cobalt or nickel elements formed thereover and the silicide films SC are formed.

Figure 9:
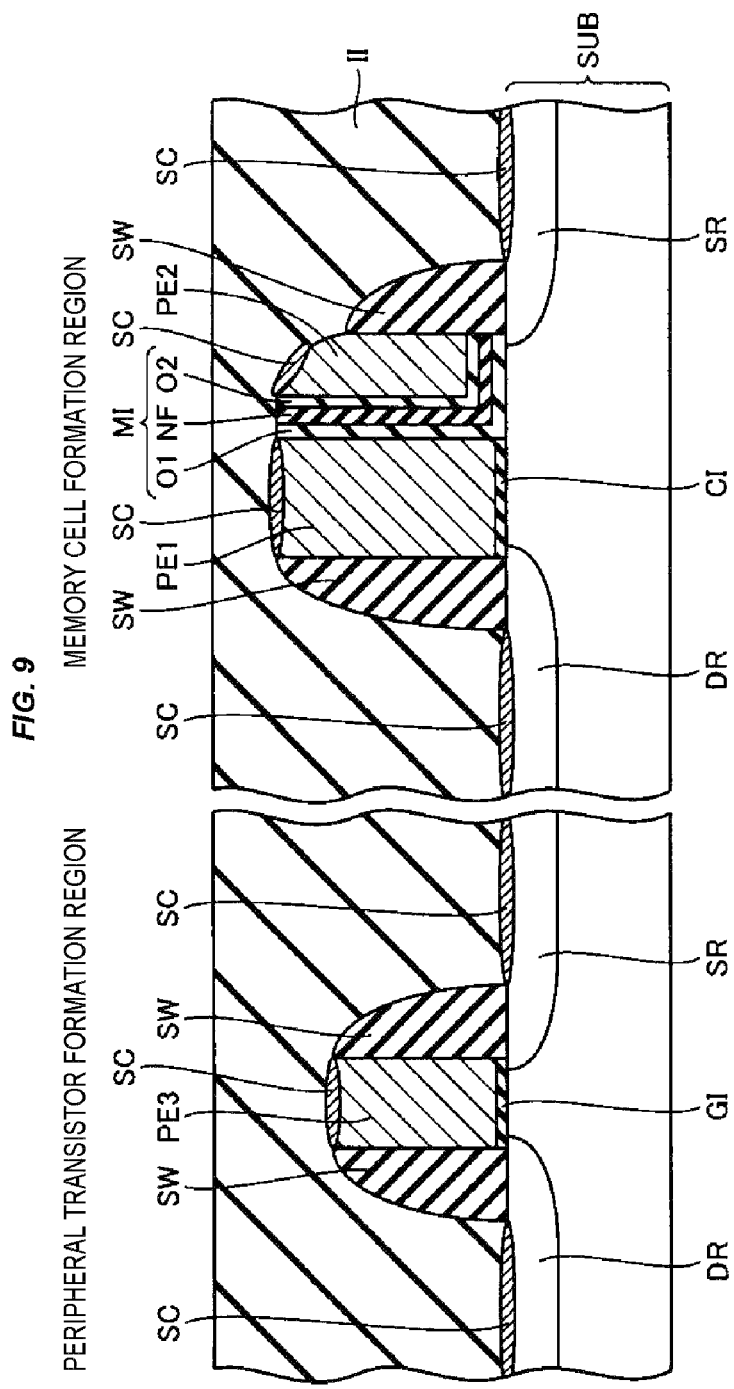
FIG. 9 is a schematic cross-sectional view showing the fifth process in a manufacturing method for a semiconductor device of one embodiment.

With reference to FIG. 4 and FIG. 9, the interlayer insulating layer II is formed on the major surface of the semiconductor substrate SUB so as to cover the upper surfaces of the first to third stacked structures, which include the first dummy electrode PE1, the second dummy electrode PE2, and the third dummy electrode PE3, and the like ("interlayer insulating layer formation" in FIG. 4). The interlayer insulating layer II is, for example, a silicon oxide film and is formed by, for example, a CVD method.

Figure 10:
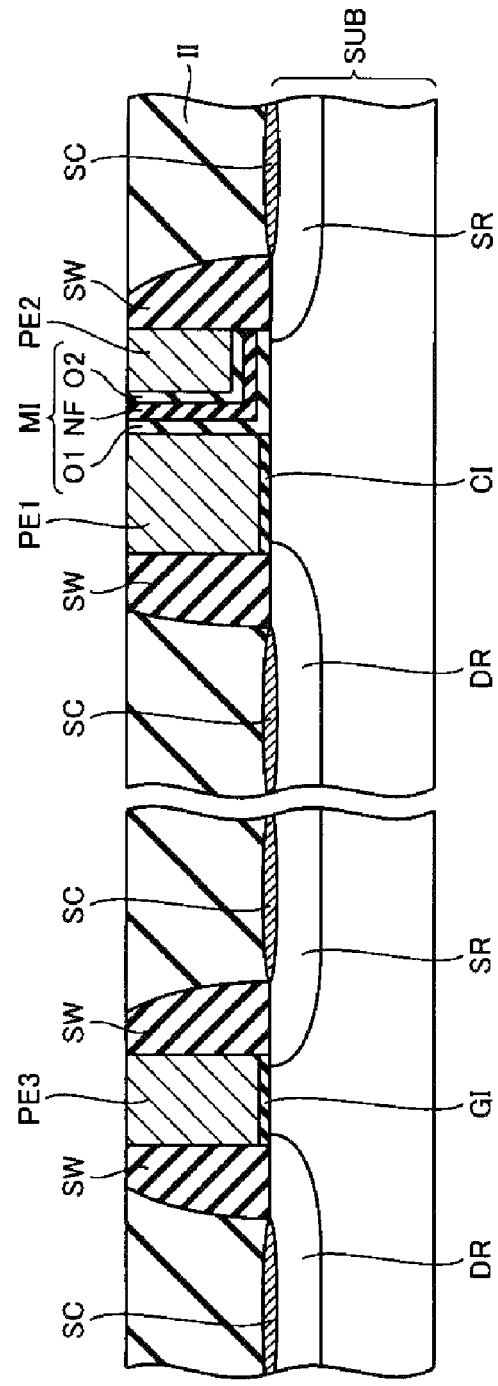
FIG. 10 is a schematic cross-sectional view showing the sixth process in a manufacturing method for a semiconductor device of one embodiment.

With reference to FIG. 4 and FIG. 10, the upper surfaces of the first and second stacked structures including parts of the interlayer insulating layer II are polished so as to expose the upper surfaces of the first dummy electrode PE1 and the second dummy electrode PE2 which are covered by the interlayer insulating layer II (corresponding to "CMP process 1" in FIG. 4). At this time, each of the upper surfaces in the first dummy electrode PE1 and the second dummy electrode PE2 is exposed and also apart thereof is polished so as to form an opening part on the upper surface. Preferably, this opening part has a size sufficiently large to the extent that each of the first dummy electrode PE1 and the second dummy electrode PE2 can be extracted and removed from the opening part in the subsequent process, so as not to be too small compared with the widths of the first dummy electrode PE1 and the second dummy electrode PE2 in the direction along the major surface of the semiconductor substrate SUB.

At this time, the upper surface of the third stacked structure including a part of the interlayer insulating layer II is polished so that there is exposed the upper surface of the third dummy electrode PE3 in addition to the surfaces of the first and second dummy electrodes PE1 and PE2. The upper surface of the third stacked structure is polished at the same time as the upper surfaces of the first and second stacked structures. That is, since the third stacked structure is formed here so as to have a lower height than the first and second stacked structures, the polishing is continued until the upper surface of the third dummy electrode PE3 is exposed, successively after the upper surfaces of the first and second stacked structures (dummy electrodes PE1 and PE2) have been exposed.

Preferably, the polishing here is performed by, for example, an ordinary CPM. Furthermore, after the polishing, processing is performed so that the upper faces of the interlayer insulating layer II and the upper surfaces of the dummy electrodes PE1, PE2, and PE3 become flat.

Figure 11:
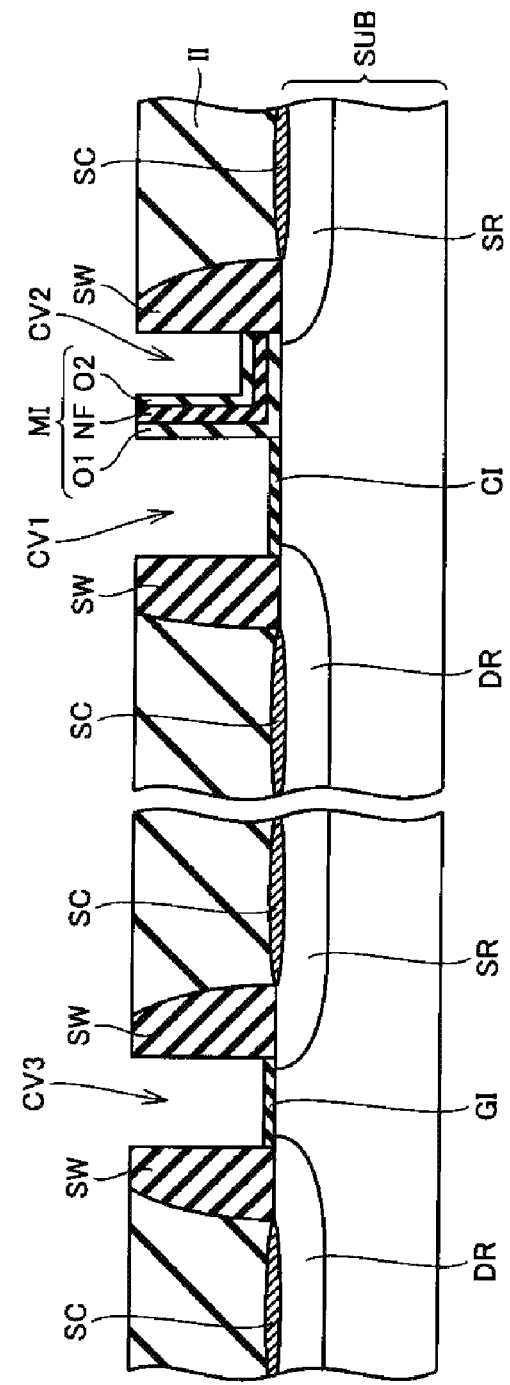
FIG. 11 is a schematic cross-sectional view showing the seventh process in a manufacturing method for a semiconductor device of one embodiment.

With reference to FIG. 4 and FIG. 11, the first dummy electrode PE1 and the second dummy electrode PE2 are removed by a typical photolithography and etching (corresponding to "peripheral, CG, MG gate poly removal" in FIG. 4). By this processing, a first opening part CV1 and a second opening part CV2 are formed in the region where the first dummy electrode PE1 has been formed and in the region where the second dummy electrode PE2 has been formed, respectively.

At this time, in addition to the first and second dummy electrodes PE1 and PE2, the third dummy electrode PE3 is removed at the same time as the first and second dummy electrodes PE1 and PE2, and a third opening part CV3 is formed in the region where the third dummy electrode PE3 has been formed.

Figure 12:
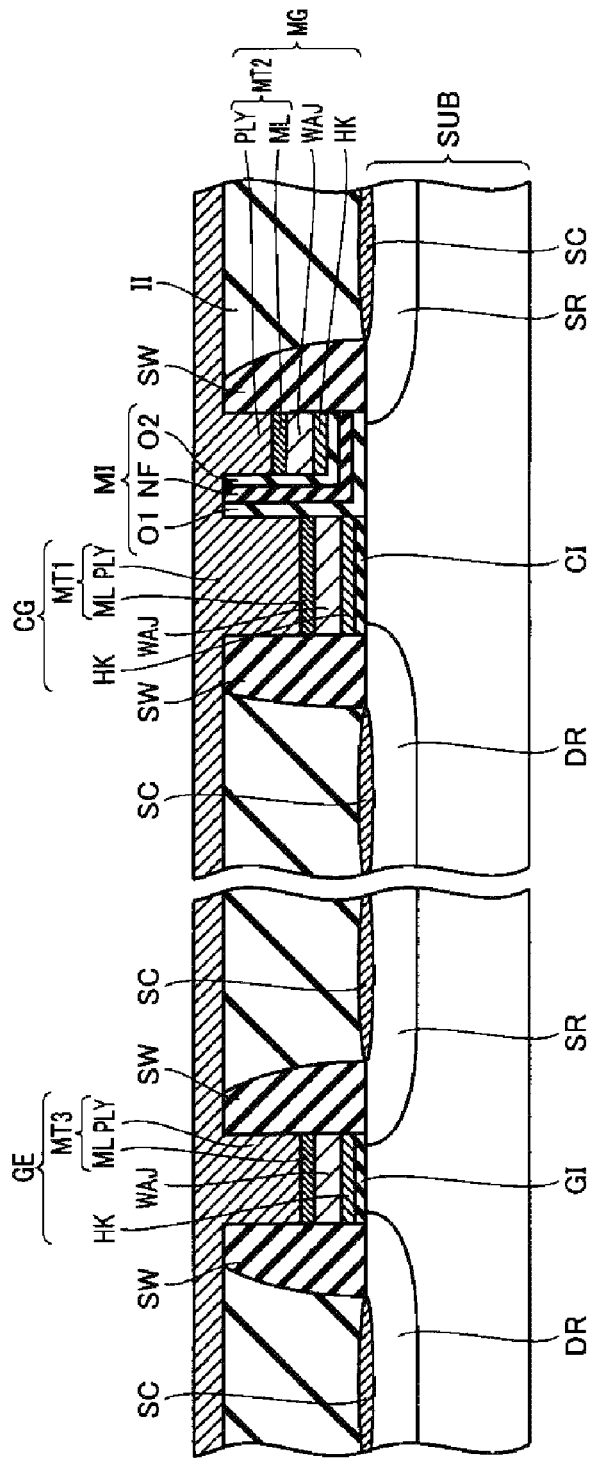
FIG. 12 is a schematic cross-sectional view showing the eighth process in a manufacturing method for a semiconductor device of one embodiment.

With reference to FIG. 4 and FIG. 12, in the memory cell formation region, the high dielectric constant insulating film HK (dielectric film) and the adjustment film WAJ are formed in this order in the first opening part CV1 (on the upper surface of the control gate insulating film CI), and further the metal film ML and the polycrystalline silicon film PLY are formed thereover in this order as the metal-containing film MT1. Thereby, the metal-containing stacked film is deposited (embedded) on the upper surface of the interlayer insulating layer II and in the first opening part CV1, and as a result, there is formed a stacked structure constituting the first metal-containing film (control gate film CG). That is, the metal-containing film MT1, the high dielectric constant insulating film HK, and the adjustment film WAJ are embedded in the first opening part CV1, and thus the control gate film CG is formed.

Note that, here, the stacked film combining the metal film ML and the polycrystalline silicon film PLY is defined as the "metal-containing film (MT1)", the stacked film combining the high dielectric constant insulating film HK and the adjustment film WAJ is defined as "another film", and the stacked film combining the metal-containing film and above another film is defined as a "metal-containing stacked film". From a relationship between the thickness in each of the films constituting the metal-containing stacked film and the depth of the opening part CV1, the structure may have an aspect in which only the polycrystalline silicon film PLY of the metal-containing stacked film is deposited on the upper surface of the interlayer insulating layer II as shown in FIG. 12.

The high dielectric constant insulating film HK has a higher dielectric constant than the control gate insulating film CI (first insulating film). As the high dielectric constant insulating film HK, a hafnium-series oxide film, for example, is formed by a CVD method or the like. AS the adjustment film WAJ, a lanthanoid-series oxide film, for example, is formed by a CVD method, or the like. In addition, as the metal film ML, a titanium nitride or tantalum-titanium thin film, for example, is formed by a sputtering method, for example. Furthermore, the polycrystalline silicon film PLY is formed by, for example, a CVD method.

At the same time as the above-described control gate film CG, the high dielectric constant insulating film HK and the adjustment film WAJ (another film) are formed in the second opening part CV2 (on the upper surface of the extension part in the memory gate insulating film MI) so as to be in contact with the side face part of the memory gate insulating film MI, and furthermore the metal film ML and the polycrystalline silicon film PLY (metal-containing film MT2) are formed thereover in this order. Thereby, a stacked structure is formed constituting the second metal-containing film (memory gate film MG) as the metal-containing stacked film. That is, the metal-containing film MT2, the high dielectric constant insulating film HK, and the adjustment film WAJ are embedded in the second opening part CV2, and thus the memory gate film MG is formed.

Moreover, at the same time as the control film CG and the memory gate film MG, the high dielectric constant insulating film HK and the adjustment film WAJ (another film) are formed in the third opening part CV3 (on the upper surface of the gate insulating film GI), and furthermore the metal film ML and the polycrystalline silicon film PLY (metal-containing film MT3) are formed thereover in this order. Thereby, a stacked structure is formed constituting the third metal-containing film (gate film GE) as the metal-containing stacked film. That is, the metal-containing film MT3, the high dielectric constant insulating film HK, and the adjustment film WAJ are embedded in the third opening part CV3, and thus the gate film GE is formed. The above-described process corresponds to "high-k/metal embedding" in FIG. 4.

This process of forming the high dielectric constant insulating film HK and the adjustment film WAJ is performed after the above-described heat treatment for forming the silicide film SC. More specifically, preferably, heat treatment is not performed until the semiconductor device is completed after the process of forming the high dielectric constant insulating film HK and the adjustment film WAJ. Here, the thermal treatment indicates processing such as annealing performed at a high temperature (e.g., 500° C., 800° C., or the like) (high temperature thermal treatment) performed after the formation of the drain region DR, the silicide film SC, or the like. For example, also in the subsequent processes, a process of film deposition for forming a wiring and the like exists, and the temperature of the semiconductor substrate SUB is increased also in the film deposition. Therefore, while strictly such a film deposition process can be included in the thermal treatment, such temperature increase is assumed not to be included in the thermal treatment here and such temperature increase may occur after the process of forming the high dielectric constant insulating film HK and the adjustment film WAJ.

With reference to FIG. 4, FIG. 12, and FIG. 2, after that, by "CMP process 2", the polycrystalline silicon film PLY formed so as to be in contact with the upper surface of the interlayer insulating layer II shown in FIG. 12 is removed and the upper surface of the interlayer insulating layer II is polished until the interlayer insulating layer II is exposed as shown in FIG. 2. As a result of the interlayer insulating layer II being exposed, the upper surfaces of the control gate film CG, the memory gate film MG, and the gate film GE which include the polycrystalline silicon films PLY and the like embedded in the opening parts CV1 to CV3 are exposed and the upper surfaces thereof become flat surfaces having the same height. By the above processes, the control gate film CG, the memory gate film MG, and the gate film GE are formed.

After that, various kinds of wiring and the like are formed in the same layer as the interlayer insulating layer II and/or in the upper layer of the interlayer insulating layer II (corresponding to "wiring process" in FIG. 4), and there is formed the semiconductor device including the memory cell and the peripheral transistor of the one embodiment as shown in, for example, FIG. 1.

Next, with reference to the comparison example in FIG. 13 to FIG. 21, the function effect of the one embodiment will be explained.

Figure 13:
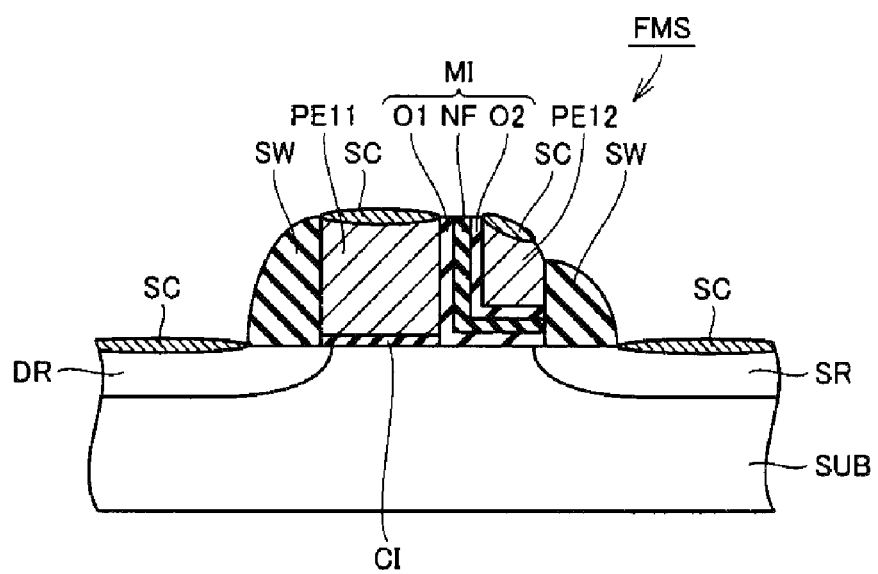
FIG. 13 is a schematic cross-sectional view of a memory cell constituting a semiconductor device of a comparison example.

With reference to FIG. 13, a memory cell FMS in a semiconductor device of a comparison example is provided with basically the same configuration as the memory cell FMS in the semiconductor device of the one embodiment. Therefore, the same sign as in FIG. 1 is attached to an element in FIG. 13 having the same configuration as in FIG. 1 and explanation thereof will not be repeated.

The memory cell FMS in FIG. 13 is different from the memory cell FMS of the one embodiment shown in FIG. 1 in that the control gate film is formed of a polycrystalline silicon film PE11 (same as the dummy electrode PE1) and the memory gate is formed of a polycrystalline silicon film PE12 (same as the dummy electrode PE2). The silicide films SC are formed on the upper surfaces of the polycrystalline silicon films PE11 and PE12.

Figure 14:
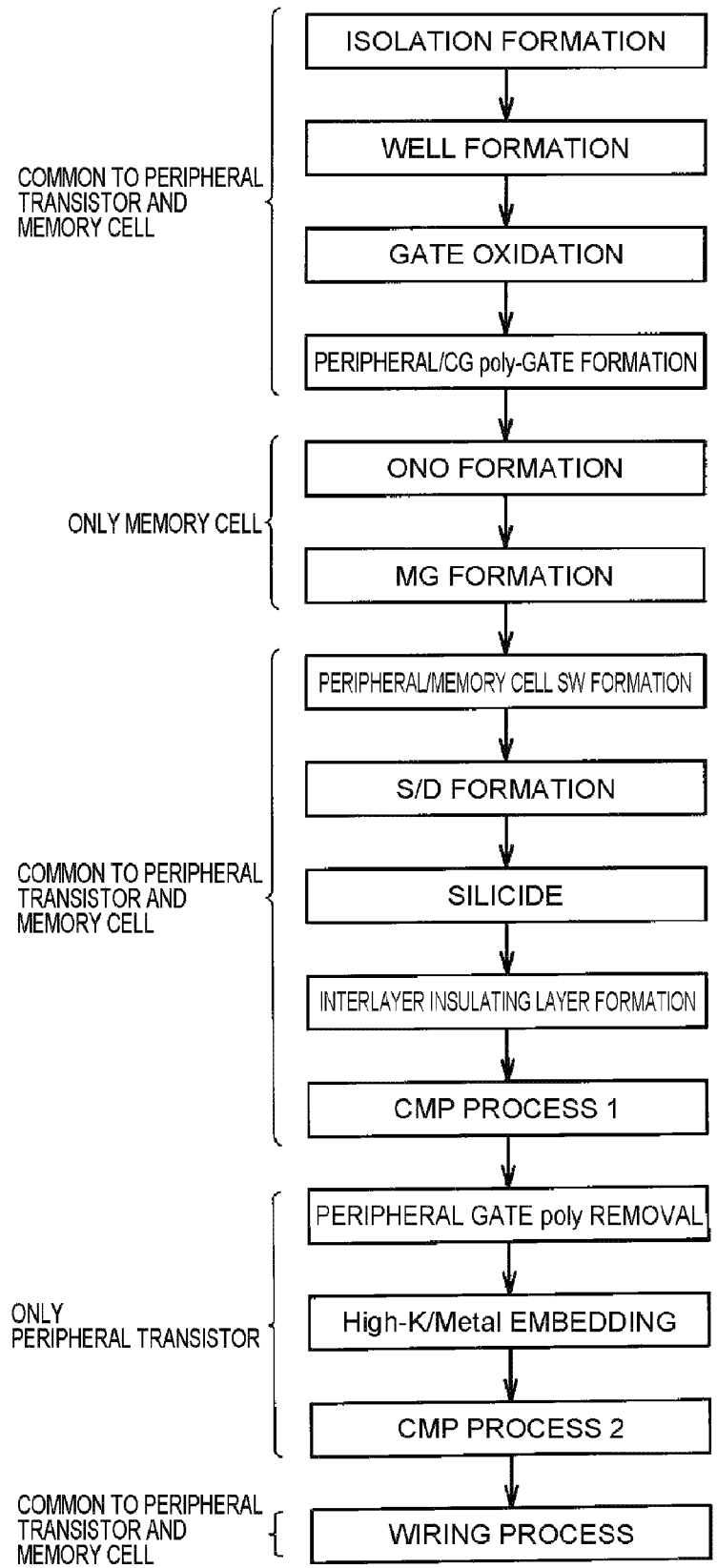
FIG. 14 is a flowchart explaining a manufacturing method for a semiconductor device of a comparison example.
Figure 15:
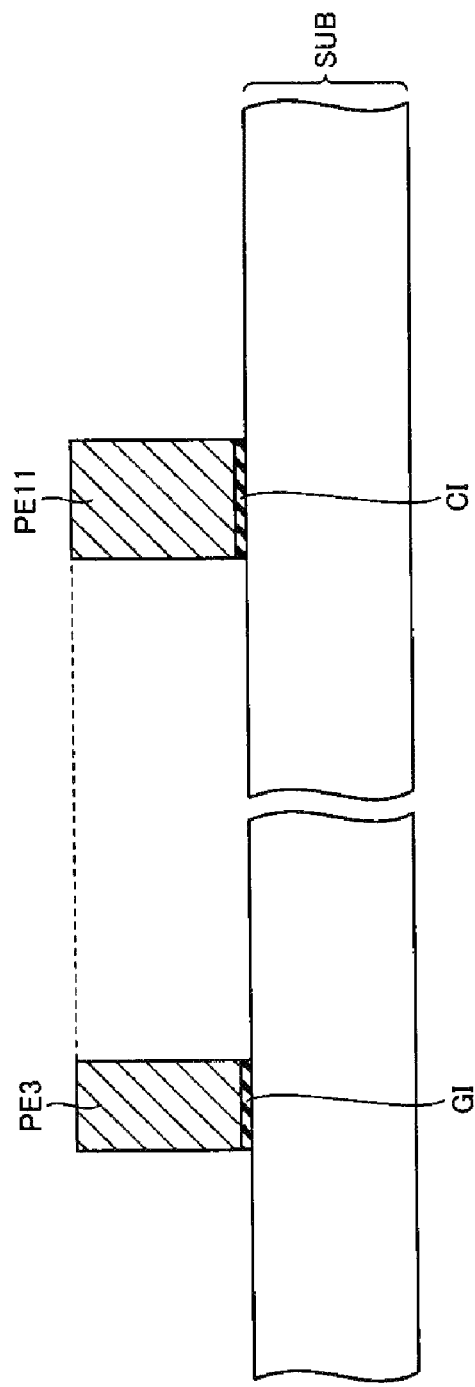
FIG. 15 is a schematic cross-sectional view showing the first process of a manufacturing method for a semiconductor device of a comparison example.

With reference to FIG. 14, in a manufacturing method of the semiconductor device of the comparison example, while the polycrystalline silicon dummy electrode PE3 which is formed in "peripheral & CG dummy poly gate formation" in the manufacturing method of the one embodiment in FIG. 4 is formed as a dummy and removed in the same way as in the one embodiment, the polycrystalline silicon film PE11 is not removed and used as it is as the electrode of the memory cell FMS. That is, the transistor TR as the peripheral circuit is formed by the gate-last process using the dummy electrode, but the memory cell FMS is formed by the gate-first process not using the dummy electrode. In the following, with reference to FIG. 14 to FIG. 18, the manufacturing method of the semiconductor device in the comparison example will be explained.

With reference to FIG. 14, in the same way as in the one embodiment, the semiconductor substrate SUB is prepared and "isolation formation" and "well formation" are performed. Next, with reference to FIG. 14 and FIG. 15, the control gate insulating film CI and the gate insulating film GI are formed over the major surface of the semiconductor substrate SUB, at the same time. Furthermore, the polycrystalline silicon film PE11, which functions as the control gate film and is in contact with the upper surface of the control gate insulating film CI, and the third dummy electrode PE3, which is in contact with the upper surface of the gate insulating film GI, are formed at the same time. Note that, here, the polycrystalline silicon film PE11 and the third dummy electrode PE3 are formed so as to have approximately the same thickness. The above processes correspond to "gate oxidation" and "peripheral/CG poly-gate formation" of FIG. 14.

Figure 16:
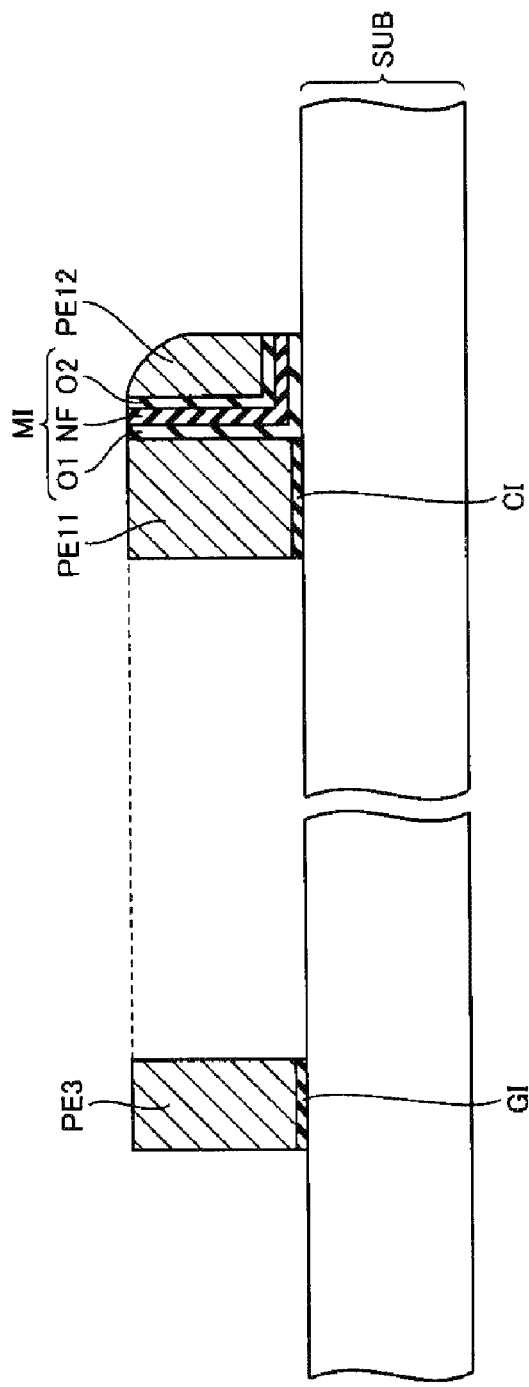
FIG. 16 is a schematic cross-sectional view showing the second process of a manufacturing method for a semiconductor device of a comparison example.

With reference to FIG. 14 and FIG. 16, the memory gate insulating film MI is formed as in FIG. 6 (corresponding to "ONO formation" in FIG. 14), and then the polycrystalline silicon film PE12 which functions as the memory gate film is formed (corresponding to "MG formation" in FIG. 14).

Figure 17:
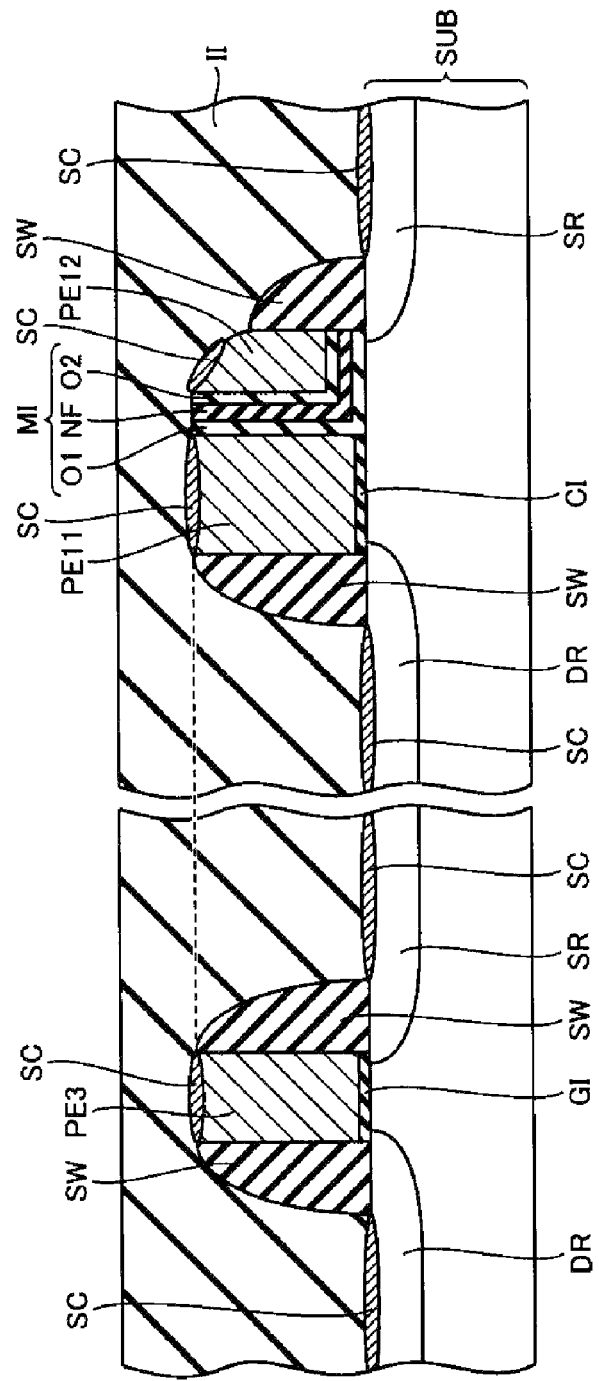
FIG. 17 is a schematic cross-sectional view showing the third process of a manufacturing method for a semiconductor device of a comparison example.

With reference to FIG. 14 and FIG. 17, the side wall insulating films SW are formed as in FIG. 7 (corresponding to "peripheral/memory cell SW formation" in FIG. 14), the drain regions DR and the source regions SR are formed (corresponding to "S & D formation" in FIG. 14), and the silicide films SC are formed (corresponding to "silicide" in FIG. 14). Furthermore, the thermal treatment which is not shown in the drawing is performed and the interlayer insulating layer II is formed as in FIG. 9 (corresponding to "interlayer insulating layer formation" in FIG. 14).

Figure 18:
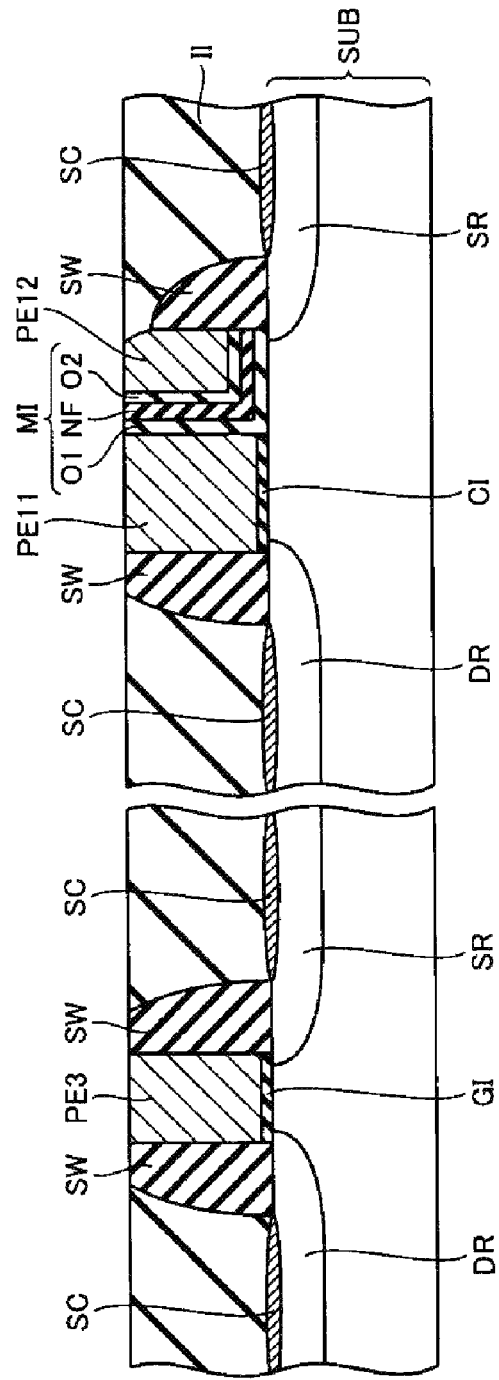
FIG. 18 is a schematic cross-sectional view showing the fourth process of a manufacturing method for a semiconductor device of a comparison example.

With reference to FIG. 14 and FIG. 18, as in FIG. 10, the interlayer insulating layer II is polished until the upper surfaces of the polycrystalline silicon films PE11, PE12 and PE3 are exposed (corresponding to "CMP process 1" in FIG. 14).

However, while in the process of FIG. 18, basically, it is only necessary to expose only the upper surface of the the third dummy electrode PE3 in the peripheral transistor formation region, all the upper surfaces of the third dummy electrode PE3, the polycrystalline silicon film PE11, and the polycrystalline silicon film PE12 are polished. Thereby, the silicide films SC on the upper surfaces of the polycrystalline silicon films PE11 and PE12 are scraped off. Since the polycrystalline silicon films PE11 and PE12 are formed of polycrystalline silicon, gate resistances are increased if the silicide films SC thereover do not exist. Such a problem can occur because the polycrystalline silicon film PE11 and the third dummy electrode PE3 are formed so as to have approximately the same thickness as each other.

Figure 19:
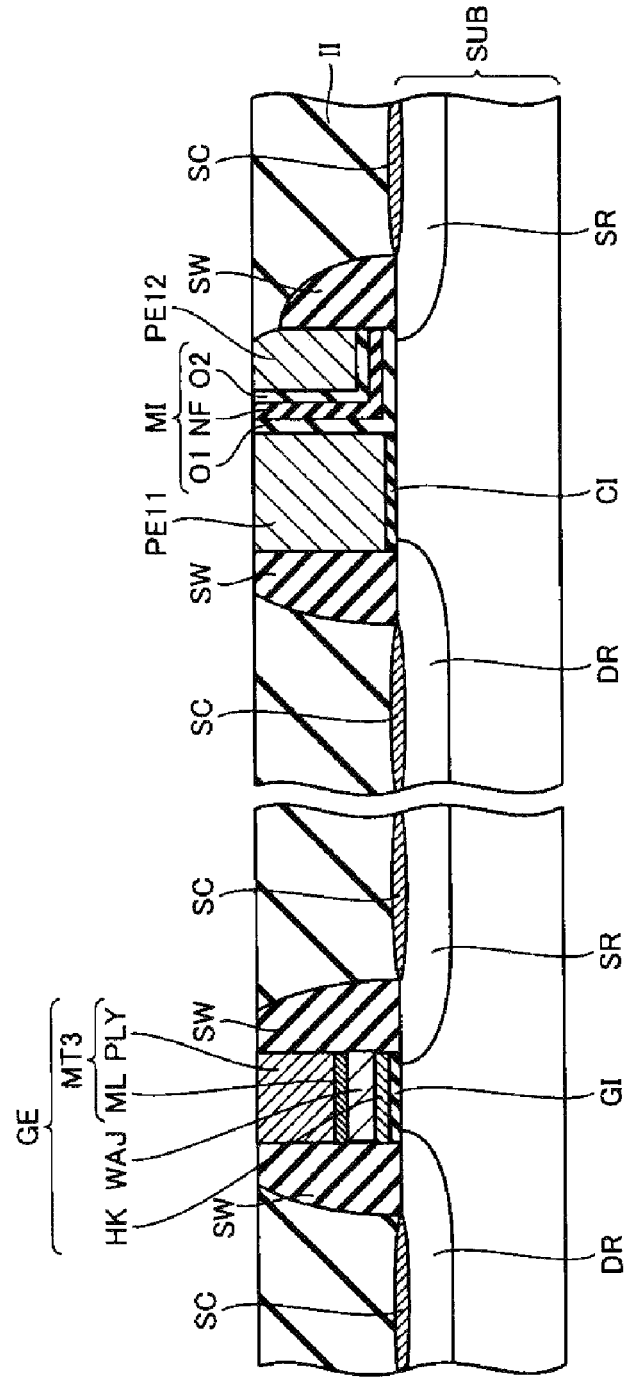
FIG. 19 is a schematic cross-sectional view showing the fifth process of a manufacturing method for a semiconductor device of a comparison example.

With reference to FIG. 14 and FIG. 19, in the state that the silicide films SC are exposed over the polycrystalline silicon films PE11 and PE12, the third dummy electrode PE3 is removed only in the peripheral transistor formation region (corresponding to "peripheral gate poly removal" in FIG. 14), the high dielectric constant insulating film HK and the adjustment film WAJ are formed over the gate insulating film GI in the region where the third dummy electrode PE3 has been removed, and further the metal film ML and the polycrystalline silicon film PLY are formed thereover in this order as the metal-containing film MT3, and thus the gate film GE is formed (corresponding to "high-k/metal embedding" in FIG. 14). After that, processing corresponding to "wiring process" in FIG. 14 is performed as in the one embodiment.

Figure 20:
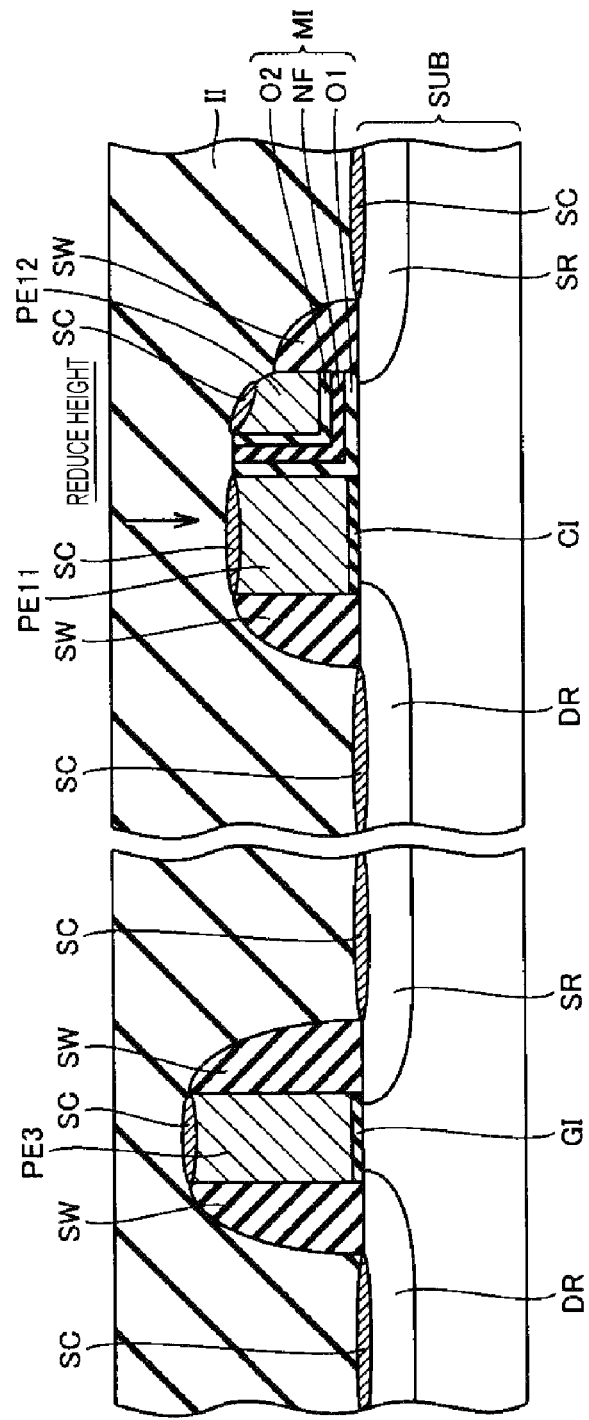
FIG. 20 is a schematic cross-sectional view showing an aspect in which the memory cell of FIG. 18 is formed having a smaller thickness, as another comparison example.
Figure 21:
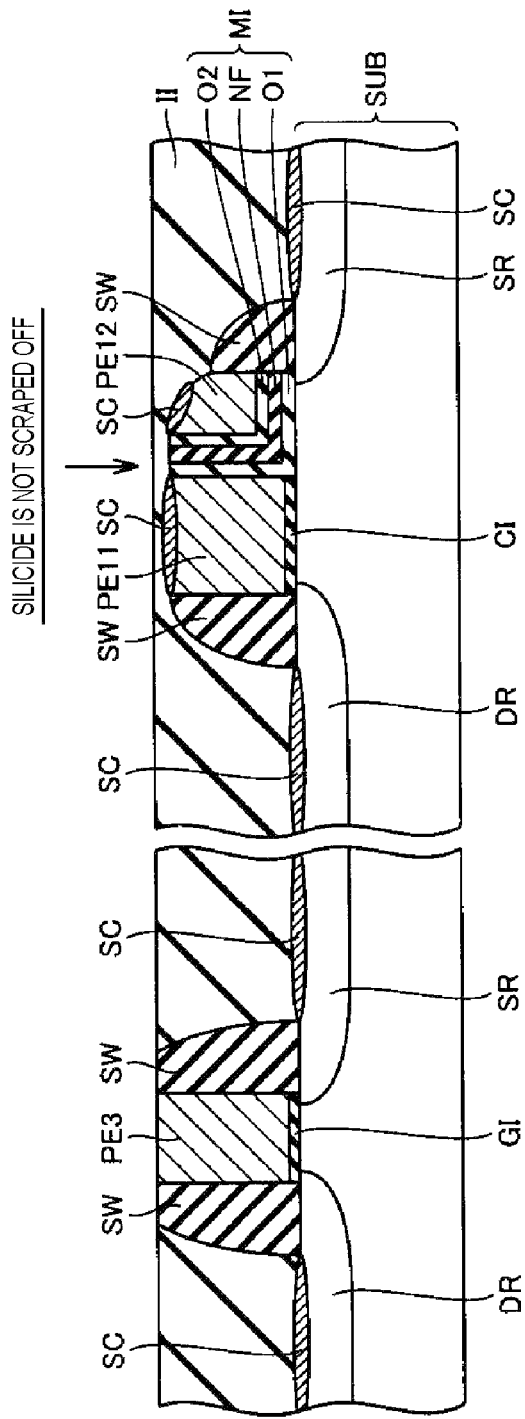
FIG. 21 is a schematic cross-sectional view showing an aspect in which the upper surface of the peripheral transistor in FIG. 20 is polished.

In order to solve the problem in which the high-resistance is reached because, as described above, the silicide films SC do not exist on the upper surfaces of the polycrystalline silicon films PE11 and PE12, there may be suppressed the polishing of the polycrystalline silicon films PE11 and PE12 and the silicide films SC thereover in the memory cell formation region which is formed by the gate-first process, as shown in FIG. 20 and FIG. 21. That is, the polycrystalline silicon films PE11 and PE12 may be formed to have lower heights (smaller thicknesses) than the third dummy electrode PE3. In this way, even when the silicide film SC of the third dummy electrode PE3 is polished in the peripheral transistor formation region, the silicide films SC of the polycrystalline silicon films PE11 and PE12 are not polished in the memory cell formation region, and thus it is possible to keep the gate resistances low.

Actually, however, the polycrystalline silicon film PE12 of the memory cell has a cross-sectional shape sloping down toward the right-hand side as with the side wall insulating film SW, and thus there is a possibility of losing the shape if the polycrystalline silicon film PE12 is formed to have a lower height (smaller thickness). Furthermore, if the polycrystalline silicon film PE12 has a smaller thickness, impurities that are to be ion-implanted to the polycrystalline silicon film PE12 pass through the polycrystalline silicon film PE12, and thus there is a possibility of becoming difficult to implant impurities, in an appropriate amount, into the polycrystalline silicon film PE12.

On the contrary, without forming the memory cell lower than the peripheral transistor as in FIG. 20 and FIG. 21, it is preferable to form the peripheral transistor lower and to form the memory cell higher (thicker). The miniaturization of the peripheral transistor is under way in order to improve element operation speed, and the gate height is becoming lower along with the miniaturization. If the peripheral transistor is formed higher, the aspect ratio of the gate cross section is increased and the balance thereof cannot be secured. Therefore, it is preferable to form the gate of the peripheral transistor lower than that of the memory cell.

However, this configuration causes again the problem in which the silicide films SC of the polycrystalline silicon films PE11 and PE12 in the memory cell are removed as in the above-described processes of FIG. 14 to FIG. 19.

That is, when the memory cell FMS is formed by the gate-first process and the peripheral transistor TR is formed by the gate-last process, even if the polycrystalline silicon films PE11 and PE12 of the memory cell FMS are formed to have any magnitude relationship of thickness (height) with the third electrode PE3 of the peripheral transistor, a problem as described above can occur and reliability of a final product has a probability of being degraded.

Basically, in the manufacturing method of forming the memory cell FMS by the gate-first process and of forming the peripheral transistor TR by the gate-last process, it is necessary to increase the number of processes only for subjecting the gate-last process to a certain region, and thus the manufacturing method is very complicated.

Accordingly, it has been found that, by forming both of the memory cell FMS and the peripheral transistor TR by gate-last process as in the one embodiment, it is possible to provide a semiconductor device having a higher reliability without increasing the number of processes in comparison with the number of processes of the comparison example in which only the peripheral transistor TR is formed by the gate-last process.

Specifically, as in the one embodiment, preferably the first and second dummy electrodes PE1 and PE2 are formed to have a larger thickness than the third dummy electrode PE3. Thereby, it is possible to suppress the shape losing of the memory cell electrode and also to make the peripheral transistor thinner by miniaturization of the peripheral transistor. Furthermore, since the second dummy electrode PE2 is formed at the side wall part of the first dummy electrode PE1, the upper surface of the second dummy electrode PE2 is slanted. Therefore, if the second dummy electrode PE2 is not more than the third dummy electrode PE3, the exposed part of the second dummy electrode PE2 becomes narrower in the process shown in FIG. 10, and it becomes difficult to remove the second electrode in the process of FIG. 11. Furthermore, it also becomes difficult to embed the metal film into the opening part in the process of FIG. 12. Accordingly, in the one embodiment, the second dummy electrode PE2 is configured to be higher than the third dummy electrode PE3.

When the first and second dummy electrodes PE1 and PE2 are formed thicker than the third dummy electrode PE3, the upper surface of the third dummy electrode PE3 is polished, and thus the upper surfaces of the first and second dummy electrodes are also polished. In this manner, the upper surfaces of the first and second electrodes PE1 and PE2 are polished and the opening parts are formed, and thus it is possible to securely remove the first and second electrodes PE1 and PE2 through these opening parts in the subsequent process.

In this way, in the one embodiment, the first dummy electrode PE1 of the dummy control gate and the second dummy electrode PE2 of the dummy memory gate in the memory cell FMS are formed higher than the third dummy electrode PE3 of the dummy gate in the peripheral transistor TR. Thereby, after the flattening process by CMP, it is possible to securely remove the dummy control gate, the dummy memory gate, and the dummy gate, and to embed the metal films into the opening parts after the removal. Then, it is possible to form both of the memory cell FMS and the peripheral transistor TR easily by the gate-last process.

As a result, it is not necessary to form the peripheral transistor and the memory cell differently by the gate-last process and by the gate-first process, respectively, as in the processes shown in FIG. 14 to FIG. 19, and it is possible to reduce the number of process processes significantly. Resultantly, influence of characteristic variation becomes small because of the reduction in the number of processes, and reliability as a semiconductor device is enhanced.

Note that to form the first and second dummy electrodes PE1 and PE2 thicker than the third dummy electrode PE3 does not cause a problem at all because the first and second dummy electrodes PE1 and PE2 are electrodes to be removed in the assembly and testing process. By forming the first and second dummy electrodes PE1 and PE2 thicker than the third dummy electrode PE3, it is possible to cause each of the side wall insulating film SW and the memory gate insulating film MI in the memory cell finally to have approximately the same height (thickness) as the peripheral transistor.

Next, in the one embodiment, the dummy electrodes PE1 to PE3 formed of polycrystalline silicon formed once are removed, and after that, the control gate film CG, the memory gate film MG, and the gate film GE are formed. These films include metal-containing films MT1 to MT3, and thus have resistances smaller than the dummy electrodes PE1 to PE3 formed of polycrystalline silicon. Therefore, it is possible to suppress resistance increase caused by miniaturization of the peripheral transistor and the memory cell. While the metal-containing films MT1 to MT3 include the polycrystalline silicon films PLY, it is possible to reduce the resistance values thereof sufficiently by including the metal films ML.

Furthermore, since the control gate film CG, the memory gate film MG and the like include the metal films ML, gate depletion is suppressed. Therefore, inverted gate capacitance is increased and it is possible to improve short channel characteristics.

Since the memory gate film MG and the like include the metal films ML, it is possible to suppress electron injection from the memory gate film MG into the silicon nitride film NF through change in the work function of the memory gate film MG, and resultantly it is possible to erase data more deeply (more securely) in the memory cell FMS.

Further, by causing the control gate film GE and the like to include the high dielectric constant insulating films HK, it is possible to maintain a high capacitance property even if it becomes difficult to make the control gate insulating film CI and the like thinner.

When the high dielectric constant insulating film HK is used, however, there may be a case where it becomes difficult to control the work function of the memory gate film MG. Accordingly, the adjustment film WAJ is formed for adjusting the work function, and thus the work function of the memory gate film MG can be adjusted. However, since the adjustment film WAJ is weak against heat, there may be a case where the work function cannot be adjusted when thermal treatment such as annealing is performed on the source region SR and the drain region DR after the memory gate film MG including the adjustment film WAJ has been formed, for example.

Accordingly, the so-called gate-last process is performed, that is, the dummy electrodes PE1 and PE2 are formed before there are formed the control gate film CG and the memory gate film MG constituting the memory cell FMS, the dummy electrodes PE1 and PE2 are removed after the typical transistor process including the above-described (high temperature) heat treatment, and then the control gate film CG and memory gate film MG including the adjustment films WAJ are formed.

In this way, the adjustment film WAJ is prevented from being adversely affected by the heat and the work function is adjusted more easily. As a result, it is possible to perform the data erase more securely (more deeper) in the memory gate film MG.

Since each of the control gate film CG and the memory gate film MG has a lower resistance than the dummy electrodes PE1 and PE2, it is not necessary to form the silicide film SC on the upper surface thereof after the control gate film CG and the memory gate film MG have been formed. Therefore, it is not necessary to perform high temperature thermal treatment such as annealing as described above after the control gate film CG and the memory gate film MG have been formed, and it is possible to obtain the above effect. Furthermore, since the silicide films SC are not formed on the upper surfaces of the control gate film CG and the memory gate film MG, it is possible also to suppress short circuit between these electrodes caused by contact between the silicide films SC over these electrodes.

Note that, as described above, the upper surfaces of the dummy electrodes PE1 and PE2 and the like is preferably polished so as to be exposed perfectly in "CMP process 1" of FIG. 10. Thereby, the dummy electrodes PE1 and PE2 and the like can be removed securely in the process of FIG. 11.

Furthermore, also the gate film GE of the peripheral transistor has the same configuration as the control gate film CG and the memory gate film MG of the memory cell, and thus it is possible to cause the peripheral transistor TR to have a higher capacitance and a lower resistance. In addition, since the gate film GE of the peripheral transistor can be formed at the same as the control gate film CG and the memory gate film MG of the memory cell, it is possible to suppress increase in the number of processes.

(Second Embodiment)

Figure 22:
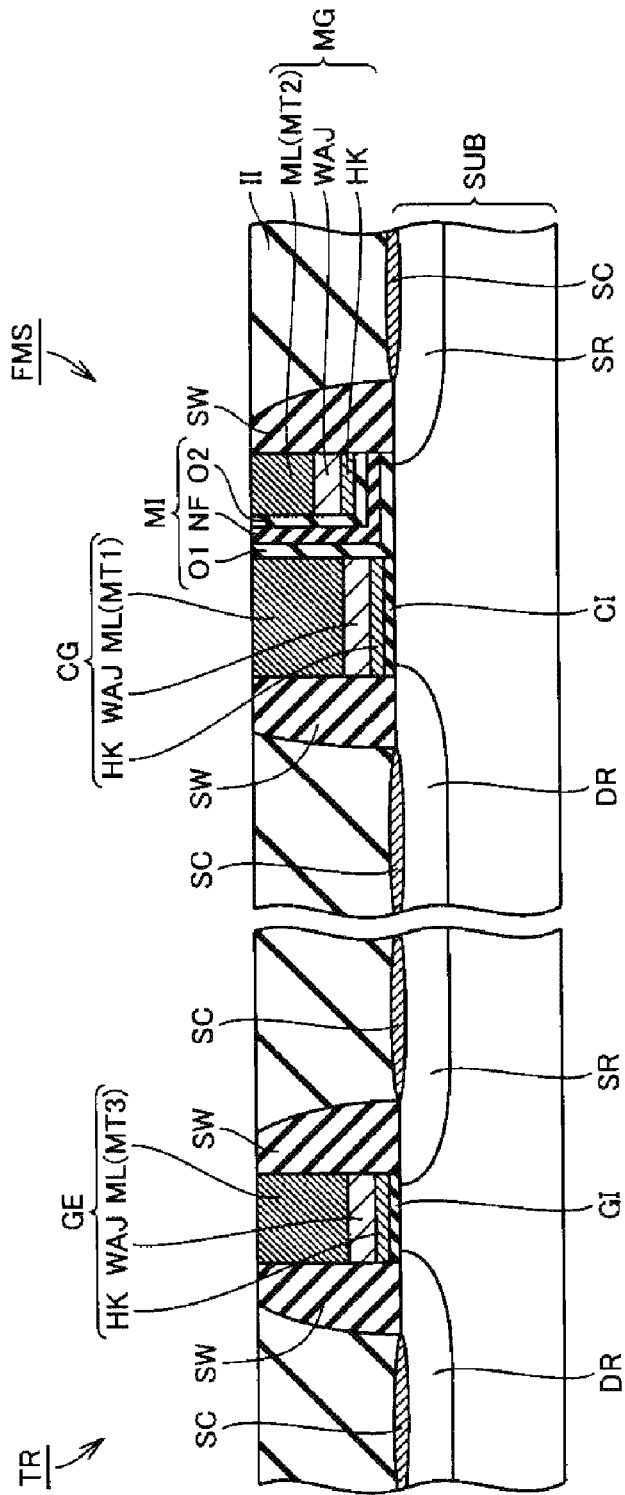
FIG. 22 is a schematic cross-sectional view of a memory cell of a second embodiment and a peripheral transistor as a peripheral circuit for the memory cell.

With reference to FIG. 22, a semiconductor device of the present embodiment is provided with basically the same configuration as the semiconductor device of the first embodiment shown in FIG. 2. The present embodiment, however, is different from the first embodiment in that each of the metal-containing films MT1 to MT3 does not include the polycrystalline silicon PLY and includes only the metal film ML. The metal film ML is, for example, a titanium nitride thin film.

The metal-containing films MT1 to MT3 of the present embodiment have approximately the same thicknesses as the metal-containing films MT1 to MT3 of the first embodiment. The thickness of the metal film ML in the present embodiment is approximately equal to the sum of the thicknesses of the metal film ML and the polycrystalline silicon film PLY in the first embodiment.

The present embodiment is different from the first embodiment only in the above-described point and the same as the first embodiment in the other points, and thus also in FIG. 22, the same sign as in the first embodiment is attached to the same constituent as in the first embodiment and explanation thereof will not repeated. This is the same also in each of the subsequent embodiments.

In the first embodiment, it is necessary to form the two layer of the metal film ML and the polycrystalline silicon film PLY for forming each of the metal-containing films MT1 to MT3, whereas in the present embodiment, only one layer of the metal film ML may be formed. Thereby, the process is more simplified.

Furthermore, the titanium nitride thin film of metal is disposed instead of the polycrystalline silicon film PLY, and thus the resistance can be reduced in each of the whole metal-containing films MT1 to MT3.

(Third Embodiment)

Figure 23:
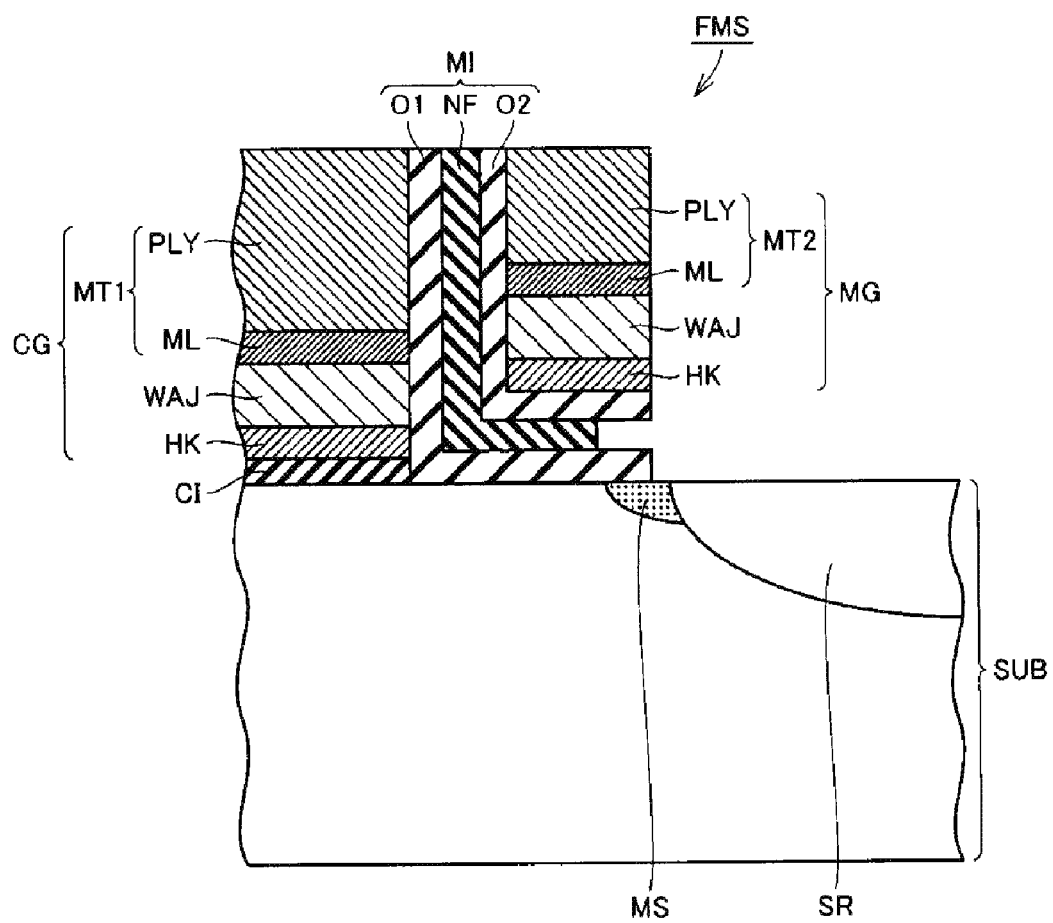
FIG. 23 is a schematic cross-sectional view showing a memory cell configuration of a third embodiment in partial enlargement.

With reference to FIG. 23, in the present embodiment, the edge part of the extension part in the silicon nitride film NF constituting the memory gate insulating film MI is formed inside the edge parts of the extension parts in the silicon oxide films O1 and O2. As a result, the edge part of the extension part in the silicon nitride film NF is formed inside the edge part (side face on the right-hand side in FIG. 23) of the memory gate film MG. Here, "inside" means the left-hand side of FIG. 23 (side where the control gate film CG is disposed).

The silicon nitride film NF is formed inside the edge part of the memory gate film MG by over-etching as will described later, and when the side wall insulating film SW is formed, the outside of the edge part in the silicon nitride film NF is filled with this insulating film. However, as with the other embodiments, the edge parts of the silicon oxide films O1 and O2 in the memory gate insulating film MI are formed so as to have the same plane as (be flushed with) the edge part of the memory gate film MG.

The configuration of FIG. 23 is formed by a method to be described in the following.

After the memory gate insulating film MI and the second dummy electrode PE2 have been formed in the memory cell formation region as in FIG. 6, a high-concentration implantation source MS is formed, on the major surface of the semiconductor substrate SUB, inside (on the left-hand side in FIG. 23) the source region SR. This high-concentration implantation source MS is formed by ion implantation in the same way as in the source region SR and the like. The high-concentration implantation source MS is formed so that the impurity concentration in the high-concentration implantation source MS positionally continues the concentration of the source region SR.

When the memory cell is a hot-hole erase type, preferably the high-concentration implantation source MS is not provided with LDD because a steep profile by high-concentration implantation is needed. However, when the memory cell is a tunnel erase type, the high-concentration implantation source MS needs not have a high concentration and may have a lower concentration so as to have better short channel characteristics in the same way as in a typical MIS transistor.

After the formation of the high-concentration implantation source MS, only the silicon nitride film NF of the memory gate insulating film MI is over-etched selectively from the edge part of the extension part. By this processing, only for the silicon nitride film NF in the memory gate insulating film MI, the edge part thereof is formed inside the edge part of the memory gate film MG.

The present embodiment has the above configuration, and thus it is possible to improve data erase efficiency of the memory cell FMS. This will be explained in the following.

The high-concentration implantation source MS is disposed for forming holes in the silicon of the semiconductor substrate SUB in the vicinity of the edge part in the high-concentration implantation source MS and for accelerating the holes by an electric field to thereby inject the holes into the silicon nitride film NF, when the holes are injected into the silicon nitride film NF and data is erased from the memory cell FMS.

However, when the silicon nitride film NF is disposed, the electric field accelerating the holes becomes weak in this region, and thus the holes become difficult to be injected into the silicon nitride film NF directly above the high-concentration implantation source MS. As a result, there is a possibility of the slowing of the data erase.

Specifically, if the memory gate film MG overlaps directly above the high-concentration implantation source MS, usually the holes are not injected into the silicon nitride film NF directly above the high-concentration implantation source MS. This situation is caused, in particular, when an impurity diffusion region called the so-called "extension" is formed. In this case, the electric field intensity does not change between the memory gate film MG and the high-concentration implantation source MS and the date erase is performed normally. However, if the holes are injected into the silicon nitride film NF directly above the high-concentration implantation source MS, the injected holes can move to the overlapped memory gate film MG. Then, the electric field intensity between the memory gate film MG and the high-concentration implantation source MS becomes weak, and the data erase becomes slow.

Accordingly, as in FIG. 23, by the mode that the silicon nitride film NF is not disposed directly above the high-concentration implantation source MS, the weakening of the electric field that accelerates the holes is suppressed, and the holes are injected, with higher efficiency, into the silicon nitride film NF. Accordingly, it is possible to improve the data erase efficiency of the memory cell FMS.

(Fourth Embodiment)

Figure 24:
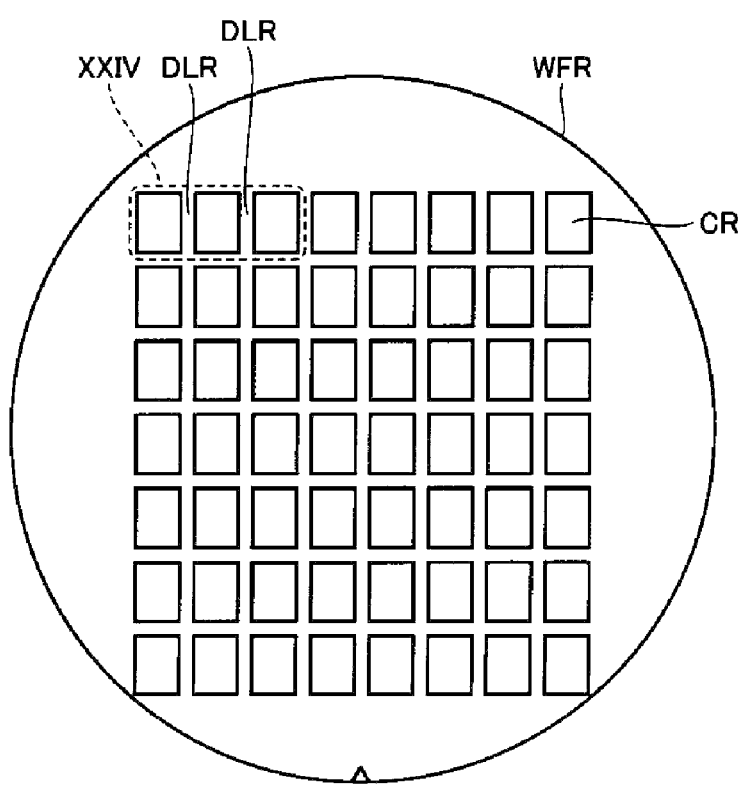
FIG. 24 is a schematic plan view for a semiconductor wafer of a fourth embodiment.

With reference to FIG. 24, in the present embodiment and each of the above-described embodiments, the memory cells FMS and the peripheral transistors TR are formed in a semiconductor wafer WFR formed of the silicon single crystal, for example. Specifically, a plurality of chip regions CR (element formation regions) is disposed in a matrix, at intervals from each other, on the major surface of the semiconductor wafer WFR. A semiconductor element such as the above-described memory cell FMS and peripheral transistor TR is formed in this chip region CR. Note that the semiconductor substrate SUB means a substrate as a foundation of the semiconductor wafer WFR, and substantially the semiconductor wafer WFR and the semiconductor substrate SUB are synonymous with each other.

A region sandwiched by a pair of the neighboring chip regions CR, in other words, a region formed in the circumference of the chip region CR is a dicing region DLR, and one semiconductor wafer WFR is divided into each of the chip regions CR in the dicing region DLR, to thereby be formed as a semiconductor chip.

Figure 25:
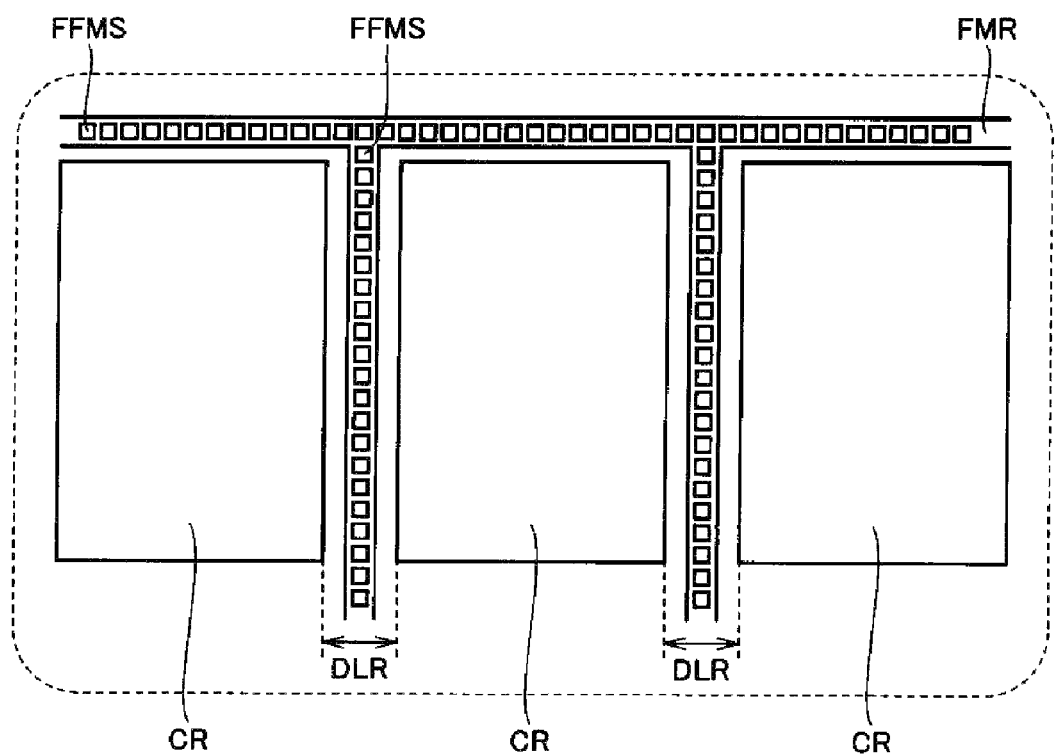
FIG. 25 is a schematic plan view showing an enlarged configuration of the region XXIV surrounded by a dotted line in FIG. 24.

With reference to FIG. 25, since the dicing region DLR is a region where the semiconductor wafer WFR is cut, an alignment mark and the like for forming the memory cell FMS and the like are formed here. However, in this dicing region DLR, a structure formation region FMR is formed in a part thereof, and a plurality of structures FFMS is formed in the structure formation region FMR.

With reference to FIG. 26, the structure FFMS in the dicing region DLR is formed as a dummy, and thus may be formed having a configuration and a material different from those of the electrodes in the memory cell FMS and the transistor TR as in the case of being formed of, for example, a polycrystalline silicon thin film.

With reference to FIG. 27, preferably, the structure FFMS of the dicing region DLR is formed in the dicing region at the same time as the process of forming the first stacked structure shown in FIG. 5 or the process of forming the second stacked structure shown in FIG. 6. As described above, the configuration and the material of the structure FFMS may be different from those of the electrodes in the first and second stacked structures and the like.

Preferably, the structure FFMS is formed having approximately the same thickness (height) as the first or second stacked structure. Note that the second dummy electrode PE2 constituting the second stacked structure is etched back and has a cross-sectional shape sloping down toward the right-hand side, and thus does not have a constant thickness (height). Here, the thickness (height) of the second stacked structure means the maximum thickness thereof, that is, the thickness at the upper surface having the same plane as (at apart flush with) the upper surface of the first stacked structure.

If the structure FFMS is formed having approximately the same height as the first dummy electrode PE1 and the second dummy electrode PE2 which are formed in each of the above-described embodiments, when there is performed CMP of polishing the upper surfaces of the dummy electrodes PE1 and PE2 as in the process shown, for example, in FIG. 10, the structure FFMS can support the force applied in CMP to the side of the semiconductor substrate SUB. Therefore, also, for example, when the dummy electrodes PE1 and PE2 have a different thickness from the dummy electrode PE3, processing amount variation of CMP depending on a position of the semiconductor substrate SUB is reduced and the CMP polishing is performed more uniformly.

When the dummy electrodes PE1 to PE3 are polished by CMP so as to have the same height as the structure FFMS under the support of the structure FFMS, as shown in FIG. 26, it is possible to cause the control gate film CG, the memory gate film MG, and the gate film GE, which are formed after that, to have approximately the same thickness as the structure FFMS.

Above-described CMP is a very important process for effectively removing the dummy electrodes PE1, PE2 and the like in the memory cell FMS and the transistor TR in performing the gate-last process, and when the work amount variation is caused in CMP, there is a possibility of causing shape abnormality in the electrode shapes in the finally formed memory cell FMS and the like. However, by forming the dummy structure FFMS in the dicing region DLR as described above, it is possible to enhance processing accuracy of CMP and it is possible to enhance the reliability of the finally formed memory cell FMS and the like.

In addition, the contents described in the embodiments will be summarized in the following.

(1) A semiconductor device is provided with a memory cell and a peripheral transistor which are formed on the major surface of a semiconductor substrate. The memory cell includes a first gate obtained by stacking a first insulating film that is formed on the major surface and a first metal-containing film that is in contact with the upper surface of the first insulating film. The memory cell includes a second gate obtained by stacking a second insulating film that is formed on the major surface so as to be in contact with the side face of the first gate and also so as to have an extension part that extends over the major surface of the semiconductor substrate and a second metal-containing film that is in contact with the second insulating film including the upper surface of the extension part in the second insulating film. The peripheral transistor includes a third gate obtained by stacking a third insulating film that is formed on the major surface and a third metal-containing film that is in contact with the upper surface of the third insulating film. The upper surfaces of the first, second, and third metal-containing films have flat faces.

(2) In the semiconductor device of (1), the first, second, and third gates have the same height.

(3) In the semiconductor device of (1), the second insulating film includes a charge accumulation film that accumulates charges.

(4) In the semiconductor device of (3), the charge accumulation film is a silicon nitride film.

(5) In the semiconductor device of (1), the second insulating film has a configuration in which a first silicon oxide film, a silicon nitride film, and a second silicon oxide film are stacked in this order.

(6) In the semiconductor device of (4) or (5), the edge part of the silicon nitride film is disposed inside the edge part of the second metal-containing film.

(7) In the semiconductor device of (1), the memory cell includes a drain region and a source region which are formed on the major surface and disposed so as to sandwich the first and second gates. Silicide is formed in the drain region and the source region.

(8) In the semiconductor device of (1), the peripheral transistor includes a drain region and a source region which are formed on the major surface and disposed so as to sandwich the third gate.

(9) In the semiconductor device of (1), each of the first, second, and third metal-containing films includes a metal-containing film (may include another film). The metal-containing film is configured with only a titanium nitride thin film.

(10) In the semiconductor device of (1), each of the first, second, and third metal-containing films includes a metal-containing film (may include another film). The metal-containing film has a configuration in which a titanium nitride thin film and a polycrystalline silicon thin film are stacked in this order.

(11) The semiconductor device of (9) or (10), each of the first, second, and third metal-containing films has a configuration in which a dielectric film having a higher dielectric constant than the first, second, and third insulating films, an adjustment film adjusting the work function of the high dielectric constant insulating film, and the metal-containing film are stacked in this order.

(12) In the semiconductor device of (1), the major surface includes an element formation region where the memory cell and the transistor are formed, and a dicing region which is formed in the circumference of the element formation region. In the dicing region, there is further included a process in which a structure is formed having the same thickness as the first, second, and third gates.

As described above, while the invention achieved by the present inventors has been explained specifically according to the embodiments, it is needless to say that the present invention is not limited to the above-described embodiments and various modifications are possible within the scope not departing from the gist thereof.

What is claimed is:

1. A method of manufacturing a semiconductor device including a memory cell of a nonvolatile memory formed in a first region of a semiconductor substrate and a MOS-type transistor formed in a second region of the semiconductor substrate, the method including:
    (a) forming a first dummy gate electrode over the semiconductor substrate via a first insulating film and a second dummy gate electrode over the semiconductor substrate via a second insulating film in the first region, and forming a third dummy gate electrode over the semiconductor substrate via a third insulating film in the second region, the second dummy gate electrode being disposed adjacent to the first dummy gate electrode via a fourth insulating film, the second dummy gate electrode having a height from a surface of the semiconductor substrate to an upper surface of the second dummy gate electrode that is greater than a height of the third dummy gate electrode from the surface of the semiconductor substrate to an upper surface of the third dummy gate electrode;
    (b) forming an interlayer insulating layer so as to overlap an upper surface of the first dummy gate electrode, the upper surface of the second dummy gate electrode and the upper surface of the third dummy gate electrode;
    (c) polishing parts of the interlayer insulating layer, the first dummy gate electrode, the second dummy gate electrode, and the third dummy electrodes so that the upper surfaces of the first dummy gate electrode, the second dummy gate electrode and third dummy electrode are exposed from the interlayer insulating layer;
    (d) after step (c), removing the first dummy electrode, the second dummy electrode and the third dummy electrode; and
    (e) after step (d), filling a metal-containing film in a first opening part which is a region from which the first dummy gate electrode has been removed in step (d), a second opening part which is a region from which the second dummy gate electrode has been removed in step (d) and a third opening part which is a region from which the third dummy gate electrode has been removed in step (d).

2. The method of manufacturing the semiconductor device according to claim 1, further including:
    (f) forming the first gate electrode of the memory cell, the second gate electrode of the memory cell and the third gate electrode of the MOS-type transistor by polishing the metal-containing film and separating the metal-containing film into respective parts of the first gate electrode, the second gate electrode and the third gate electrode.

3. The method of manufacturing the semiconductor device according to claim 2, wherein, in step (f), the metal-containing film are polished such that the interlayer insulating layer is exposed in the first region and the second region.

4. The method of manufacturing the semiconductor device according to claim 1, further including (g) embedding a metal-containing insulating film in the first opening part, the second opening part and the third opening part, step (g) is after step (d) but before step (e).

5. The method of manufacturing the semiconductor device according to claim 4, wherein the metal-containing insulating film has a higher dielectric constant than a silicon oxide film.

6. The method of manufacturing the semiconductor device according to claim 1, wherein, in step (a), the second dummy gate electrode is formed such that the height of the upper surface of the second dummy gate electrode is gradually lowered in a direction away from the first dummy gate electrode.

7. The method of manufacturing the semiconductor device according to claim 1,
    wherein the height of the upper surface of the second dummy gate electrode is a height from the surface of the semiconductor substrate to a position of the upper surface of the second dummy gate electrode, the position of the upper surface of the second dummy gate electrode being nearest the first dummy gate electrode in a direction in which the first dummy gate electrode and the second dummy gate electrode are disposed adjacent to each other.

8. The method of manufacturing the semiconductor device according to claim 1, wherein step (a) further includes:
    (a1) forming a fifth insulating film in the first region so as to overlap the first dummy gate electrode, the fifth insulating film being for forming the second insulating film and the fourth insulating film;

(a2) forming a first silicon film over the fifth insulating film; and (a3) forming the second dummy gate electrode by etching back the first silicon film by anisotropic etching.

9. The method of manufacturing the semiconductor device according to claim 8, wherein the height of the upper surface of the second dummy gate electrode is a height from the surface of the semiconductor substrate to a position of the upper surface of the second dummy gate electrode at which the upper surface of the second dummy gate electrode is contacted to the fifth insulating film.

10. The method of manufacturing the semiconductor device according to claim 1, wherein the second insulating film includes a charge accumulation portion.

11. The method of manufacturing the semiconductor device according to claim 1, wherein the second insulating film includes a silicon nitride film.

12. The method of manufacturing the semiconductor device according to claim 1, wherein the second insulating film has a configuration in which a first silicon oxide film, a silicon nitride film, and a second silicon oxide film are stacked in this order.

13. The method of manufacturing the semiconductor device according to claim 1, wherein the first dummy gate electrode, the second dummy gate electrode and the third dummy gate electrode include a silicon film respectively.

\* \* \* \* \*